United States Patent
Kim et al.

(10) Patent No.: US 7,904,639 B2
(45) Date of Patent: Mar. 8, 2011

(54) MODULAR COMMAND STRUCTURE FOR MEMORY AND MEMORY SYSTEM

(75) Inventors: Jin-Ki Kim, Kanata (CA); HakJune Oh, Kanata (CA); Hong Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 646 days.

(21) Appl. No.: 11/840,692

(22) Filed: Aug. 17, 2007

(65) Prior Publication Data

US 2008/0052449 A1 Feb. 28, 2008

Related U.S. Application Data

(60) Provisional application No. 60/839,329, filed on Aug. 22, 2006, provisional application No. 60/902,003, filed on Feb. 16, 2007, provisional application No. 60/892,705, filed on Mar. 2, 2007.

(51) Int. Cl.
   *G06F 12/00* (2006.01)
(52) U.S. Cl. ........... 711/103; 711/157; 711/E12.003
(58) Field of Classification Search .......... 711/103, 711/157, E12.003
   See application file for complete search history.

(56) References Cited

U.S. PATENT DOCUMENTS

| | | | |
|---|---|---|---|
| 4,617,566 A | 10/1986 | Diamond | |
| 4,796,231 A | 1/1989 | Pinkham | |
| 5,132,635 A | 7/1992 | Kennedy | |
| 5,204,669 A | 4/1993 | Dorfe et al. | |
| 5,243,703 A | 9/1993 | Farmwald et al. | |
| 5,249,270 A | 9/1993 | Stewart et al. | |
| 5,319,598 A | 6/1994 | Aralis et al. | |
| 5,404,460 A | 4/1995 | Thomsen et al. | |
| 5,430,859 A | 7/1995 | Norman et al. | |
| 5,437,018 A | 7/1995 | Kobayashi et al. | |
| 5,473,563 A | 12/1995 | Suh et al. | |
| 5,473,566 A | 12/1995 | Rao | |
| 5,473,577 A | 12/1995 | Miyake et al. | |

(Continued)

FOREIGN PATENT DOCUMENTS

EP 07800456.1 7/2009

(Continued)

OTHER PUBLICATIONS

Atmel Corp., "High Speed Small Sectored SPI Flash Memory", pp. 1-22, 2006.

(Continued)

*Primary Examiner* — Shane M Thomas
(74) *Attorney, Agent, or Firm* — Shuji Sumi

(57) ABSTRACT

A system including a memory system and a memory controller is connected to a host system. The memory system has at least one memory device storing data. The controller translates the requests from the host system to one or more separatable commands interpretable by the at least one memory device. Each command has a modular structure including an address identifier for one of the at least one memory devices and a command identifier representing an operation to be performed by the one of the at least one memory devices. The at least one memory device and the controller are in a series-connection configuration for communication such that only one memory device is in communication with the controller for input into the memory system. The memory system can include a plurality of memory devices connected to a common bus.

5 Claims, 27 Drawing Sheets

U.S. PATENT DOCUMENTS

| | | | |
|---|---|---|---|
| 5,535,357 | A | 7/1996 | Moran et al. |
| 5,636,342 | A | 6/1997 | Jeffries |
| 5,721,840 | A | 2/1998 | Soga |
| 5,729,683 | A | 3/1998 | Le et al. |
| 5,740,379 | A | 4/1998 | Hartwig |
| 5,802,399 | A | 9/1998 | Yumoto et al. |
| 5,806,070 | A | 9/1998 | Norman et al. |
| 5,828,899 | A | 10/1998 | Richard et al. |
| 5,859,809 | A | 1/1999 | Kim |
| 5,959,930 | A | 9/1999 | Sakurai |
| 6,002,638 | A | 12/1999 | John |
| 6,091,660 | A | 7/2000 | Sasaki et al. |
| 6,144,576 | A | 11/2000 | Leddige et al. |
| 6,148,363 | A | 11/2000 | Lofgren et al. |
| 6,208,556 | B1 | 3/2001 | Akaogi et al. |
| 6,230,233 | B1 | 5/2001 | Lofgren et al. |
| 6,295,618 | B1 | 9/2001 | Keeth |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,317,812 | B1 | 11/2001 | Lofgren et al. |
| 6,438,064 | B2 | 8/2002 | Ooishi |
| 6,442,098 | B1 | 8/2002 | Kengeri |
| 6,453,365 | B1 | 9/2002 | Habot |
| 6,456,528 | B1 | 9/2002 | Chen |
| 6,594,183 | B1 | 7/2003 | Lofgren et al. |
| 6,601,199 | B1 | 7/2003 | Fukuda et al. |
| 6,643,728 | B1 * | 11/2003 | Crutchfield et al. ......... 710/315 |
| 6,658,509 | B1 | 12/2003 | Bonella et al. |
| 6,680,904 | B1 | 1/2004 | Kaplan et al. |
| 6,715,044 | B2 | 3/2004 | Lofgren et al. |
| 6,717,847 | B2 | 4/2004 | Chen |
| 6,754,807 | B1 | 6/2004 | Parthasarathy et al. |
| 6,763,426 | B1 | 7/2004 | James et al. |
| 6,799,235 | B2 | 9/2004 | Bormann et al. |
| 6,807,106 | B2 | 10/2004 | Gonzales et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,928,501 | B2 | 8/2005 | Andreas et al. |
| 6,944,697 | B2 | 9/2005 | Andreas |
| 6,950,325 | B1 | 9/2005 | Chen |
| 6,978,402 | B2 | 12/2005 | Hirabayashi |
| 6,996,644 | B2 | 2/2006 | Schoch et al. |
| 7,031,221 | B2 | 4/2006 | Mooney et al. |
| 7,032,039 | B2 | 4/2006 | DeCaro |
| 7,111,140 | B2 | 9/2006 | Estakhri et al. |
| 7,130,958 | B2 | 10/2006 | Chou et al. |
| 2002/0161941 | A1 | 10/2002 | Chue et al. |
| 2002/0188781 | A1 | 12/2002 | Schoch et al. |
| 2003/0009612 | A1 | 1/2003 | Latta |
| 2004/0001380 | A1 | 1/2004 | Becca et al. |
| 2004/0024960 | A1 | 2/2004 | King et al. |
| 2004/0039854 | A1 | 2/2004 | Estakhri et al. |
| 2004/0148482 | A1* | 7/2004 | Grundy et al. ................. 711/167 |
| 2004/0230738 | A1 | 11/2004 | Lim et al. |
| 2004/0256638 | A1 | 12/2004 | Perego et al. |
| 2005/0120157 | A1 | 6/2005 | Chen et al. |
| 2005/0120163 | A1* | 6/2005 | Chou et al. .................... 711/103 |
| 2005/0160218 | A1 | 7/2005 | See et al. |
| 2005/0166006 | A1 | 7/2005 | Talbot et al. |
| 2005/0207232 | A1* | 9/2005 | Delfs et al. ............... 365/185.33 |
| 2005/0289313 | A1* | 12/2005 | Roohparvar ................... 711/167 |
| 2006/0031593 | A1 | 2/2006 | Sinclair |
| 2006/0198202 | A1 | 9/2006 | Erez |
| 2007/0076479 | A1 | 4/2007 | Kim et al. |
| 2007/0076502 | A1 | 4/2007 | Pyeon et al. |
| 2007/0083701 | A1 | 4/2007 | Kapil |
| 2007/0101096 | A1* | 5/2007 | Gorobets ...................... 711/203 |
| 2007/0109833 | A1 | 5/2007 | Pyeon et al. |
| 2007/0153576 | A1 | 7/2007 | Oh et al. |
| 2007/0233903 | A1 | 10/2007 | Pyeon |
| 2007/0234071 | A1 | 10/2007 | Pyeon |
| 2007/0288686 | A1* | 12/2007 | Arcedera et al. ............. 711/103 |
| 2008/0016269 | A1 | 1/2008 | Chow et al. |

FOREIGN PATENT DOCUMENTS

| | | |
|---|---|---|
| WO | WO 2005/069150 A1 | 7/2005 |

OTHER PUBLICATIONS

Spansion, 64 Megabit CMOS 3.0 Volt Flash Memory with 50MHz SPI, Spansion, pp. 1-22 (2006).

King, et al., "Communicating with Daisy Chained MCP42XXX Digital Potentiometers", Microchip AN747, pp. 1-8, 2001.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, ONENAND4G(KFW4G16Q2M-DEB6), ONENAND2G(KFH2G16Q2M-DEB6), ONENAND1G(KFW1G16Q2M-DEB6) Flash Memory, ONENAND™ Specification Ver. 1.2, pp. 1-125, Dec. 23, 2005.

Kennedy, J., et al., "A 2GB/S Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Oshima, et al., "High-Speed Memory Architectures for Multimedia Applications", Circuits & Devices, IEEE 8755-3996/97, pp. 8-13, Jan. 1997.

Diamond, S.L., "SyncLink: High: High-speed DRAM for the Future", Micro Standards, IEEE Micro, pp. 74-75, Dec. 1996.

Atmel, "8-megabit 2.5-volt Only or 2.7-volt Only DataFlash®," Technical Specification, Atmel, Rev. 2225H-DFLSH (2004).

Samsung Electronics, "K9XXG08UXM Preliminary Flash Memory," Technical Specification, Samsung Electronics, May 3, 2005, 43 pages.

Silicon Storage Technology, "16 Mbit SPI Serial Flash," Preliminary Specification, Silicon Storage Technology Inc., (2005), 28 pages.

Stmicroelectronics, "2MBIT, Low Voltage, Serial Flash Memory with 40 MHZ SPI BUS Interface," Technical Specification, Stmicroelectronics Group of Companies, Aug. 2005, 40 Pages.

"NAND Flash Applications Design Guide," Revision 1.0, Toshiba America Electronics Components, Inc., (Apr. 2003).

Spansion Data Sheet, S70GL01GN00 MIRRORBIT Flash 1024 Megabit, 3.0 Volt-Only Page Mode Flash Memory Featuring 110 MM MIRRORBIT Process Technology, Jun. 1, 1995.

"HyperTransport TM I/O Link Specification", Revision 3.00, Document No. HTC20051222-0046-0008, Hypertransport Technology Consortium, pp. 1-428, Apr. 21, 2006.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Momodomi, M. et al., "A 4 Mb NAND EEPROM with tight programmed Vt Distribution", IEEE Journal of Solid-State Circuits, vol. 26, Issue 4, Apr. 1991, pp. 492-496.

Ohtsuka, N. et al., "A 4-Mbit CMOS EPROM", IEEE Journal of Solid-State Circuits, vol. 22, Issue 5, Oct. 1987, pp. 669-675.

Kim, et al. "A 120-mm2 64 Mb NAND Flash Memory Archieving 180 ns/Byte Effective Program Speed," IEEE Journal of Solid-State Circuits, vol. 32, No. 5, May 1977, pp. 670-680.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Takeuchi, K. et al., "A multipage cell architecture for high-speed programming multilevelNAND flash memories", IEEE Journal of Solid-State Circuits, vol. 33, Issue 8, Aug. 1998, pp. 1228-1238.

Tanzawa, et al., "A dynamic analysis of the Dickson charge pump circuit;" IEEE J. Solid-State Circuits, vol. 32, No. 8, pp. 1231-1240, Aug. 1997.

Tanaka, T. et al., "A quick intelligent page-programming architecture and a shieldedbitline sensing method for 3 V-only NAND flash memory", IEEE Journal of Solid-state Circuits, vol. 29, Issue 11, Nov. 1994, pp. 1366-1373.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Lee, J. et al., "High-Performance 1-Gb NAND Flash Memory with 0.12-μm Technology", IEEE Journal of Solid-State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Tomita, N. et al., "A 62-ns 16Mb CMOS EPROMm with Voltage Stress Relaxation Technique" IEEE Journal of Solid-State Circuits vol. 26, No. 11, Nov. 1991, pp. 1593-1599.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US pp. 129-130.

Aritome, S. et al., "A Reliable Bi-Polarity Write/Erase Technology in Flash EEPROMS", Int'l. Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, (1990), pp. 103-106.

Hara, T. et al., "A 146-mm 2 8-Gb Multi-Level NAND Flash Memory With 70-nm CMOS Technology", IEEE Journal of Solid State Circuits, Jan. 2006, vol. 41, No. 1, pp. 161-169.

Lee, S. et al., "A 3.3V 4Gb Four-Level NAND Flash Memory with 90nm CMOS Technology", ISSCC 2004/Session 2 Non-Volatile Memory/2.7, IEEE International Solid-State Circuits Conference, Feb. 15-19, 2004,Digest of Technical Papers, pp. 52-513, vol. 1, XP010722148, ISBN: 0-7803-8267-6.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Feb. 6-9, 2006, ISBN: 1-4244-0079-1.

Samsung Electronics Co. Ltd, "256M×8 Bit / 128 M×16 Bit / 512M×8 Bit NAND Flash Memory", K9K4G08U1M, May 6, 2005, pp. 1-41.

Samsung Electronics Co. Ltd, "1G×8 Bit / 1G×8 Bit NAND Flash Memory", K9F8G08UXM, May 31, 2007, pp. 1-54.

Samsung Electronics Co. Ltd, "512M×8 Bit / 1G×8 Bit NAND Flash Memory", K9XXG08UXA, May 7, 2006, pp. 1-43.

Samsung Electronics Co. Ltd, "1G×8 Bit / 2G×8 Bit / 4G×8 Bit NAND Flash Memory", K9XXG08UXA, Jul. 18, 2006, pp. 1-50.

Choi, Young, "16-Gbit MLC NAND Flash Weighs In", EETimes. com, Jul. 7, 2007, pp. 1-3, http://www.eetimes.com/showArticle.jhtml?articleID=201200825.

Gal, et al., "Algorithms and data structures for flash memories", ACM Computing Surveys (CSUR), vol. 37, No. 2, p. 138-163, Jun. 2005, Tel Aviv University.

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Samsung Electronics Co. Ltd, "2G×8 Bit NAND Flash Memory", K9GAG08U0M, Apr. 12, 2006, pp. 1-48.

Toshiba, "16 Gbit (2G×8 Bit) CMOS NAND E2PROM (Multi-Level-Cell)", TC58NVG4D1DTG00, Nov. 9, 2006.

Toshiba, "2Gbit (256M×8 Bits) CMOS NAND E2PROM", TH58NVG1S3AFT05, May 19, 2003.

WIPO, International Search Report, PCT/CA2007/001428, Dec. 6, 2007.

* cited by examiner

MODULAR COMMAND STRUCTURE FOR MEMORY AND MEMORY SYSTEM

CROSS REFERENCE TO RELATED APPLICATIONS

This application claims the benefit of priority of U.S. Provisional Patent Application No. 60/839,329 filed Aug. 22, 2006, U.S. Provisional Patent Application No. 60/902,003 filed Feb. 16, 2007, and U.S. Provisional Patent Application No. 60/892,705 filed Mar. 2, 2007, the disclosures of which are expressly incorporated herein by reference in their entirety.

FIELD OF THE INVENTION

The present invention relates generally to semiconductor memory devices and in particular to a system having multiple interconnected semiconductor memory devices and command structure for memory devices.

BACKGROUND OF THE INVENTION

Semiconductor memory devices are commonly found in many industrial and consumer electronics products. An increasing demand for higher memory capacity coupled with a requirement for smaller sizes results in a desire for memory with a density that is difficult to attain. As a result, multiple memory devices are often connected together to satisfy large memory requirements. Such multi-device memory systems can be implemented together in a single package (i.e., a multi chip system) or a multiplicity of memory device packages grouped together on a printed circuit board.

When multiple semiconductor memory devices are interconnected to function as a single system, a controller manages data flow between the individual memory devices and external interfaces providing requests for storing data, accessing data and manipulating data in the system. A command structure is used by the controller to provide those requests to the individual memory devices containing the data. The command structure may be dependent on the configuration of the interconnected memory devices and can impact performance of the system. For example, if the individual memory devices are in communication with the controller via a common bus, then only one of the individual memory devices may be asserted at any given time. If the individual memory devices are serially interconnected in a chain configuration with only one memory device connected to the controller, then commands for memory devices located later in the chain may be significantly delayed by earlier memory devices performing commands that cannot be interrupted. In a configuration of series-connected memory devices, the processing of a command at one device halts all transmission of commands onto subsequent memory devices, resulting in a suspension of any additional processing in the system.

SUMMARY OF THE INVENTION

In accordance with one aspect of the present invention, there is provided a modular command structure comprising: a device identifier comprising an address for one of a plurality of memory devices and an bank address for one of a plurality of memory banks in the one of the plurality of memory devices; and a command identifier comprising an operation code representing an operation to be performed by the one of the plurality of memory devices.

In accordance with another aspect of the present invention, there is provided, a modular command set comprising: a plurality of separatable commands representing a request from a processor for access to one of a plurality of memory devices, each of the plurality of separate commands comprising: a device identifier comprising an address for the one of a plurality of memory devices and an bank address for one of a plurality of memory banks in the one of the plurality of memory devices; and a command identifier comprising an operation code representing an operation to be performed by the one of the plurality of memory devices.

In accordance with another aspect of the present invention, there is provided a system comprising: a memory system comprising at least one memory device for storing data; a processor for managing requests for access to the memory system; and a controller for translating the requests from the processor to one or more separatable commands interpretable by the at least one memory device, each command having a modular structure comprising an address identifier for one of the at least one memory devices and a command identifier representing an operation to be performed by the one of the at least one memory devices, the at least one memory device and the controller being in a serial configuration for communication.

In accordance with another aspect of the present invention, there is provided a controller for a system having a plurality of memory devices for storing data, the controller being in a serial configuration for communication with the plurality of memory devices, the controller comprising: a first connection for receiving requests from the processor for access to the plurality of memory devices; a translator for translating the requests from the processor to a plurality of separatable commands interpretable by the plurality of memory devices, each command having a modular structure comprising an address identifier for one of the plurality of memory devices and a command identifier representing an operation to be performed by the one of the plurality of memory devices; and a second connection in serial communication with one of the plurality of memory devices for issuing the plurality of separatable commands.

In accordance with another aspect of the present invention, there is provided A method of requesting access to at least one memory device, the method comprising: determining an address including an address for the at lest one memory device; identifying a plurality of operations that in combination effect a request for access to the at least one memory device; and providing a plurality of separatable commands to the at least one memory device, each of the commands including a device identifier comprising the address and a command identifier comprising one of the plurality of operations, where the command identifier is interpretable by the memory device.

In accordance with one embodiment of the present invention, there is provided a command structure comprising: a plurality of separatable commands representing a request for access to one of a plurality of memory devices. Each of the plurality of separate commands includes: a device identifier comprising an address for the one of a plurality of memory devices and an bank address for one of a plurality of memory banks in the one of the plurality of memory devices; and a command identifier comprising an operation code representing an operation to be performed by the one of the plurality of memory devices.

In accordance with another embodiment of the present invention, there is provided a modular command structure comprising: a device identifier comprising an address for one of a plurality of memory devices and an bank address for one of a plurality of memory banks in the one of the plurality of memory devices; and a command identifier comprising an operation code representing an operation to be performed by the one of the plurality of memory devices.

In accordance with another embodiment of the present invention, there is provided a system comprising: a memory system including at least one memory device for storing data; a processor for managing requests for access to the memory system; and a controller for translating the requests from the processor to one or more separatable commands interpretable by the at least one memory device, each command having a modular structure comprising an address identifier for one of the at least one memory devices and a command identifier representing an operation to be performed by the one of the at least one memory devices; the at least one memory device and the controller being in a series-connection for communication.

For example, the at least one memory device includes at least one memory bank. The address identifier may include a device address for one of the at least one memory devices and a bank address for one of the at least one memory banks. For example, the memory device is a flash device, such as a NAND-type flash memory device.

In a case where the memory system includes a plurality of memory devices, the devices may be series-connected or connected to a common bus.

In accordance with another embodiment of the present invention, there is provided a controller for a system having a plurality of memory devices for storing data, the controller being in a series-interconnection configuration for communication with the plurality of memory devices. The controller comprising: a first connection for receiving requests for access to the plurality of memory devices; a translator for translating the requests to a plurality of separatable commands interpretable by the plurality of memory devices, each command having a modular structure comprising an address identifier for one of the plurality of memory devices and a command identifier representing an operation to be performed by the one of the plurality of memory devices; and a second connection for communication with one of the plurality of memory devices for issuing the plurality of separatable commands.

In accordance with another embodiment of the present invention, there is provided a method comprising: determining an address including a memory device address; identifying a plurality of operations effecting a request for access to a memory; and providing a plurality of separatable commands for the memory, each of the commands including a device identifier having a memory device address and a command identifier having one of the plurality of operations.

Advantageously, the method is used for translating a request for access to a memory device into a plurality of separatable commands interpretable by the memory device. The method may be used for translating a request for access to a memory device into a plurality of separatable commands interpretable by the memory device.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments, reference is made to the accompanying drawings which form a part hereof, and in which is shown by way of illustration specific sample embodiments. These embodiments are described in sufficient detail to enable those skilled in the art to practice the present invention, and it is to be understood that other embodiments may be used and that logical, mechanical, electrical and other changes may be made without departing from the scope of the present invention. Therefore, the following detailed description is not to be taken in a limiting sense.

Figure 1:
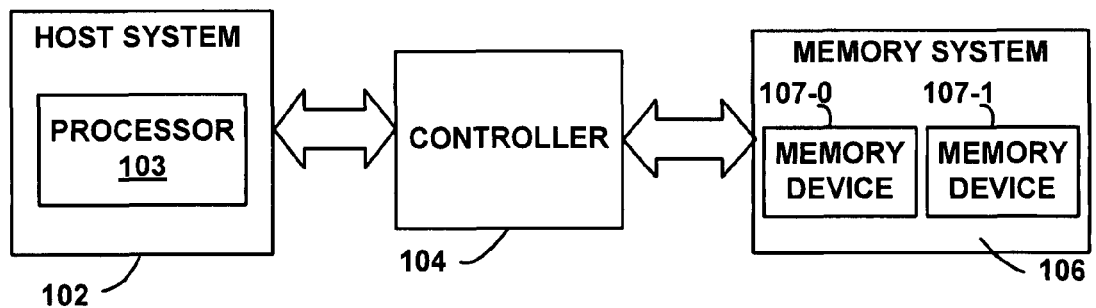
FIG. 1 is a block diagram illustrating a host system and a system having a memory system and a memory controller, to which embodiments of the present invention are applicable.

Semiconductor memory devices are often interconnected to form a large capacity memory system. FIG. 1 illustrates a system to which embodiments of the present invention are applicable. Referring to FIG. 1, a host system 102 having a processor 103 therein is connected to a system that includes a memory system 106 and a controller 104 for controlling the memory system. The memory system 106 includes at least one memory device (e.g., two flash memory devices 107-0 and 107-1). The controller 104 receives requests from the host system 102 and translates the requests into commands that are interpretable by the memory system 106. The controller 104 also translates logical addresses for the memory system 106 that are used by the host system 102 into physical addresses of the memory system 106. The controller 104 ensures that data to be stored in the memory system 106 is distributed among the memory devices 107-0, 107-1. An error correcting code (ECC) is also generated by the controller 104 to check for errors in the execution of commands.

Figure 2:
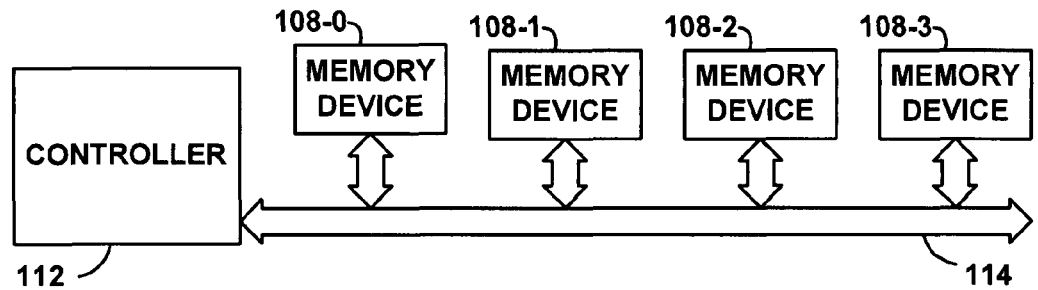
FIG. 2 is a block diagram illustrating a memory system including a plurality of memory devices and a controller connected to the memory system via a common bus, to which embodiments of the present invention are applicable.

FIG. 2 shows an example of a system configuration to which embodiments of the present invention are applicable. Referring to FIG. 2, a controller 112 communicates with a memory system including a plurality of memory devices (e.g., four flash memory devices 108-0-108-3) through a common bus 114. The controller 112 uses the common bus 114 to transfer data into and out of the memory devices 108-0-108-3. Only a designated flash memory device is asserted at a time with this configuration by asserting a chip enable signal.

Figure 3:
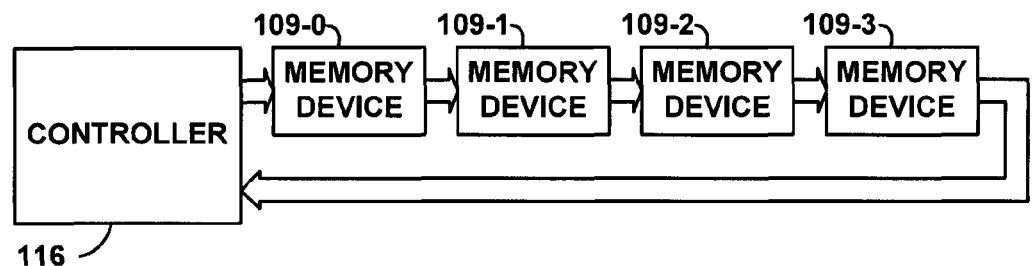
FIG. 3 is a block diagram illustrating a memory system having a plurality of memory devices that are series-interconnected and a controller connected to the memory devices, to which embodiments of the present invention are applicable.

FIG. 3 shows another example of a system configuration to which embodiments of the present invention are applicable. A memory system includes series-connected memory devices. Referring to FIG. 3, a controller 116 and a memory system including a plurality of memory devices (e.g., four flash memory devices 109-0-109-3) are interconnected in a loop configuration. Since the memory devices 109-0-109-3 are series-interconnected, only one of the devices receives data and messages incoming to the memory system through the controller 116. Each of the memory devices 109-0-109-3 is coupled to at most two other memory devices (i.e., prior and next devices). As such, data and messages coming into the memory system pass through every other memory device to reach the last device 109-3 in the series connection.

The flash memory devices can be any type of flash memories, e.g., NAND-, NOR-, AND-type flash memories. Also, the memory devices can be random access memories.

Figure 4:
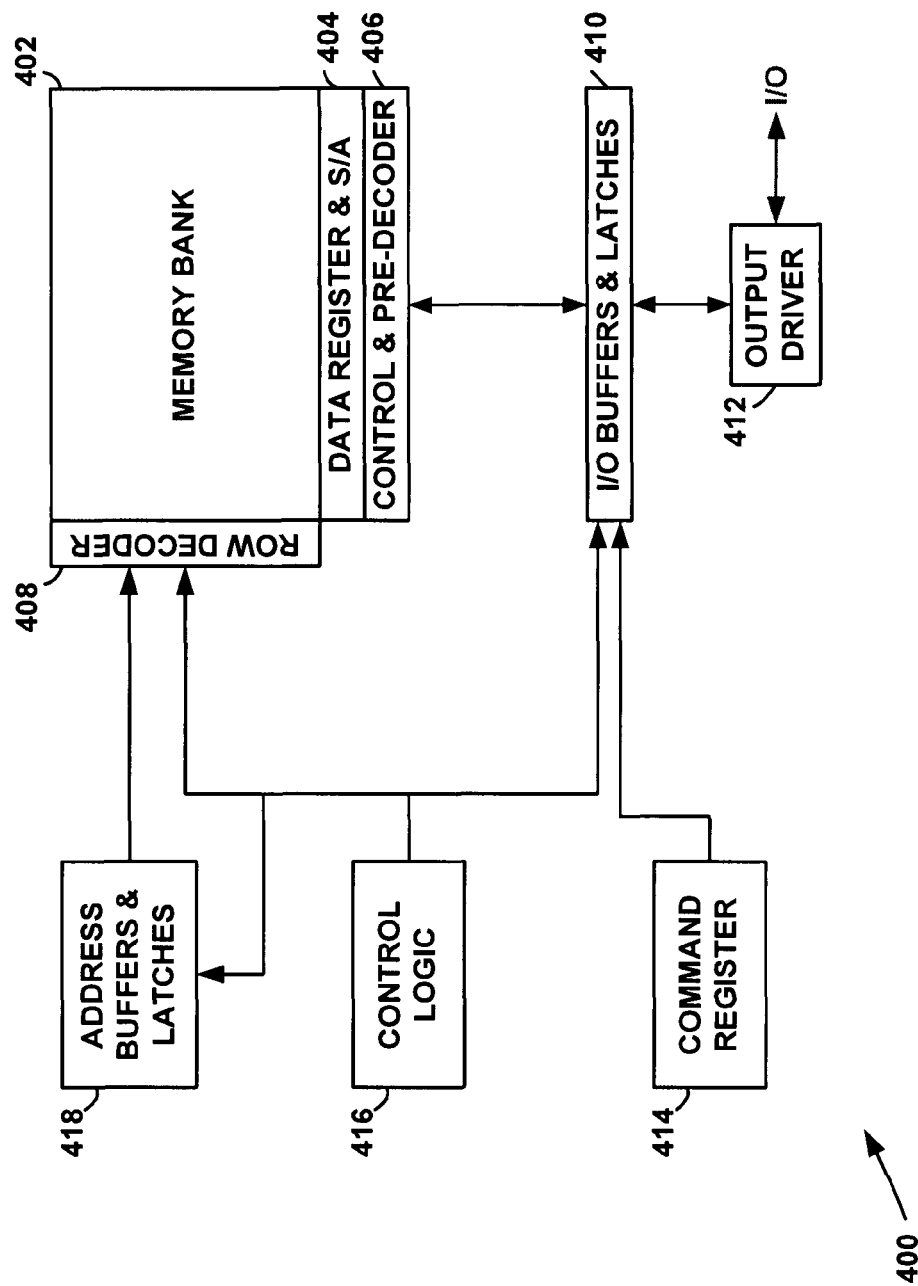
FIG. 4 is a block diagram illustrating an example of a general configuration of a flash memory device, to which embodiments of the present invention are applicable.

NAND flash memory devices are commonly interconnected to provide low cost, high density memory. FIG. 4 illustrates the functional components of a NAND flash device 400. In the NAND flash device 400, commands, addresses and data are multiplexed via common I/O pins in a chip of the device. The NAND flash device 400 has a memory bank 402 which is a cell array structure having a plurality (n) of erasable blocks. Each of the erasable blocks is subdivided into a plurality (m) of programmable pages. Each of the pages consists of (j+k) bytes. The pages are further divided into a j-byte data storage region in which data is stored and a separate k-byte are typically used for error management functions. Each page typically comprises 2,112 bytes of which 2,048 bytes are used to data storage and 64 bytes are used for error management functions. The memory bank 402 is accessed by the pages. Although FIG. 4 shows a single memory bank 402, the NAND flash device 400 may have more than one memory bank 402. Each such memory bank 402 may be able to perform concurrent page read, page program, page erase and block erase operations.

Commands for accessing the memory bank 402 are received by a command register 414 and control logic 416 from a controller (e.g. the controller 116 shown in FIG. 3). The received commands enter the command register 414 and remain there until execution. The control logic 416 converts the commands into a form that can be executed against the memory bank 402. The commands generally enter the NAND flash device 400 via the assertion of different pins on the external packaging of the chip, where different pins may be used to represent different commands. For example, the commands may include chip enable, read enable, write enable, and write protect. The read and write commands are executed on a page basis while the erase commands are executed on a block basis.

When a command is received by the command register 414 and the control logic 416, an address for the page in the memory bank 402 to which the command pertains is received by an output driver 412. The address is provided to address buffers and latches 418 and then control and predecoder 406, sense amplifier (S/A) and data register 404 and row decoder

408 for accessing the page indicated by the address. The data register 404 receives the complete page which is then provided to the I/O (input/output) buffers and latches 410 and then the output driver 412 for output from the NAND flash device 400.

For example, a read command is received by the command register 414 and the control logic 416 and an accompanying address is received by the address buffers and latches 418. The address buffers and latches 418 determine the page in which the address is located and provide a row address(es) corresponding to the page to the row decoder 408. The corresponding row is activated. The data register and S/A 404 sense the page and transfer the data from the page into the data register 404. Once the data from the entire page has been transferred to the data register, the data is sequentially read from the device via the I/O buffers and latches 410 and the output driver 412.

A program command is also processed on a page basis. The program command is received by the command register 414 and the control logic 416, an accompanying address is received by the address buffers 418 and input data are received by the output driver 412. The input data is transferred to the data register 404 through the I/O buffers and latches 410. Once all of the input data is in the data register 404, the page on which the input data is to be stored is programmed with the input data.

An erase command is processed on a block basis. The erase command is received by the command register 414 and the control logic 416 and a block address is received by the address buffers 418.

A typical NAND flash memory command uses two cycles of command to complete loading of the command. Table 1 shows an example command set of NAND flash memories.

TABLE 1

Command Set of NAND Flash

| Function | 1st Cycle | 2nd Cycle |
|---|---|---|
| Read | 00h | 30h |
| Read for Copy Back | 00h | 35h |
| Read ID | 90h | — |
| Reset | FFh | — |
| Page Program | 80h | 10h |
| Cache Program | 80h | 15h |
| Copy-Back Program | 85h | 10h |
| Block Erase | 60h | D0h |
| Random Data Input | 85h | — |
| Random Data Output | 05h | E0h |
| Read Status | 70h | |

Many of the commands issued to a NAND flash memory in the two command cycles are considered as one procedure and as such cannot be broken, interrupted, suspended or resumed. When the NAND flash memory is receiving these two command cycles, it cannot accept any additional commands other than reset and read status commands. In flash memory devices having multiple memory banks, this command structure restricts the use of banks as one bank remains inactive while the other bank is processing a command. This results in low input/output utilization when the commands being performed having long internal core operations (e.g., page read at 20 µs, page program at 200 µs and block erase at 1.5 ms). In systems having multiple flash memories being series-interconnected, this command structure may reduce the processing speed of the entire system as a flash memory device that is processing a command cannot forward other commands to subsequent flash memory devices until that processing is complete.

An example of a command structure applicable to a system according to an embodiment of the present invention includes a command field having a byte(s). For example, the command field has a first byte for device and bank addresses and a second byte for operation codes.

Figure 5A:
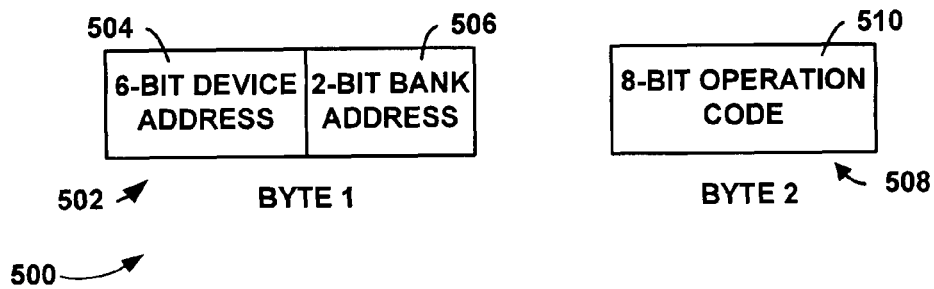
FIGS. 5A, 5B and 5C illustrate examples of modular command structures for use with a NAND flash memory, to which embodiments of the present invention are applicable.

FIG. 5A, shows an example of modular command structure for use with a NAND flash memory. In this particular example, the modular command structure is a byte basis. Referring to FIG. 5A, a modular command structure 500 includes first and second bytes 502 and 508 (Bytes 1 and 2), each having a plurality of bits. In this particular example, the first and second bytes 502 and 508 of the command structure include an eight-bit address and an eight-bit operation code, respectively. The first byte 502 has a six-bit address 504 for the destination memory device. The six-bit address 504 is used to differentiate among memory devices where the system includes a plurality of memory devices. The first byte 502 also includes a two-bit address 506 for a memory bank of the memory device for use with memory devices having a plurality of memory banks. The second byte 508 of the command structure includes an eight-bit operation code 510 indicating the command to be performed by the memory device. Table 2 illustrates examples of operation codes.

TABLE 2

Example Operation Codes for Second Byte

| Second Byte (OP7-OP0) | | | | | | | | Command | Address Input |
|---|---|---|---|---|---|---|---|---|---|
| 0 | 0 | 0 | 0 | 0 | 0 | 0 | 0 | Page Read (00h) | Row |
| 0 | 0 | 0 | 0 | 0 | 0 | 1 | 1 | Burst Data Read (03h) | Column |
| 0 | 0 | 0 | 0 | 0 | 1 | 0 | 1 | Page Read for Copy (05h) | Row |
| 0 | 0 | 0 | 0 | 1 | 0 | 0 | 1 | Burst Data Load Start (09h) | Column |
| 0 | 0 | 0 | 0 | 1 | 0 | 1 | 0 | Burst Data Load (0Ah) | Column |
| 0 | 0 | 0 | 0 | 1 | 1 | 1 | 1 | Page Program (0Fh) | Row |
| 0 | 0 | 0 | 1 | 0 | 0 | 1 | 0 | Address Input for Block Erase (12h) | Row |
| 0 | 0 | 0 | 1 | 0 | 1 | 1 | 1 | Block Erase (17h) | None |
| 0 | 0 | 0 | 1 | 0 | 1 | 0 | 0 | Address Input for Page-pair Erase (14h) | Row |
| 0 | 0 | 0 | 1 | 1 | 1 | 1 | 0 | Page-pair Erase (1Eh) | None |
| 0 | 0 | 1 | 1 | 0 | 0 | 1 | 1 | Read Device Status (33h) | None |
| 0 | 0 | 1 | 1 | 0 | 1 | 0 | 1 | Read Device ID (35h) | None |
| 0 | 0 | 1 | 1 | 1 | 0 | 0 | 1 | Write Device Address (39h) | None |

TABLE 2-continued

Example Operation Codes for Second Byte

| Second Byte (OP7-OP0) | | | | | | | | Command | Address Input |
|---|---|---|---|---|---|---|---|---|---|
| 0 | 0 | 1 | 1 | 1 | 0 | 1 | 0 | Write Configuration Register (3Ah) | None |
| 0 | 0 | 1 | 1 | 1 | 1 | 1 | 1 | Reset(3Fh) | None |

The command structure has many variations. Another example of the two-byte command structure is that the first byte has eight-bit device address (DA) and the second byte has four-bit OP code and a four-bit bank address (BA).

Figure 5B:
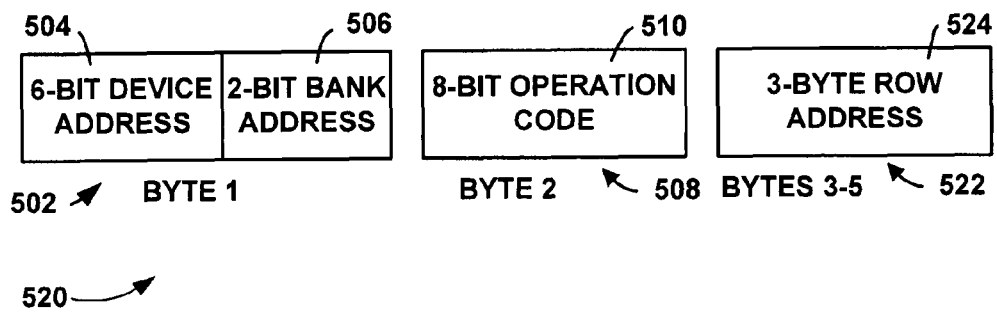

FIG. 5B shows another example of modular command structure for use with a NAND flash memory. Referring to FIG. 5B, a command structure 520 includes a plurality of bytes. In the illustrated example, the command structure 520 has a two-byte modular command structure (Bytes 1 and 2) with a three-byte row address 522 (Bytes 3-5). A partial structure of the two-byte modular command in FIG. 5B is identical to the two-byte modular command structure shown in FIG. 5A. The first byte 502 has a six-bit address 504 for the destination memory device and a two-bit address 506 for the memory bank. The second byte 508 has an eight-bit operation code 510. The three-byte row address 522 provides a 24-bit address 524 for a row(s) in the memory bank indicated in the first byte 502. This 24-bit (i.e., three-byte) row address 524 is used for commands for which a row address is required to specify a row location on which the command is to be performed.

Figure 5C:
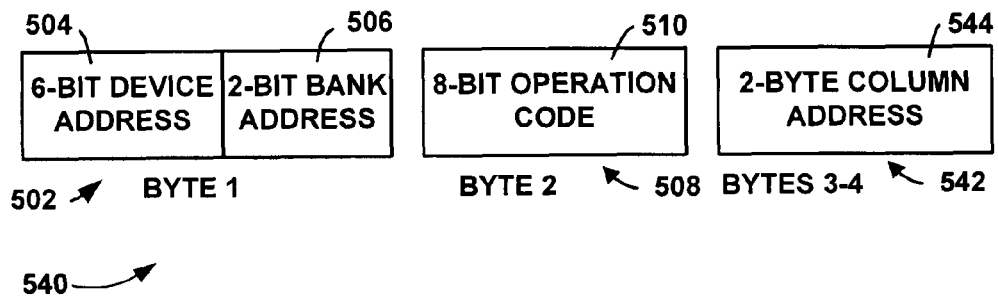

FIG. 5C shows another example of modular command structures for use with a NAND flash memory. Referring to FIG. 5C, a command structure 540 includes a plurality of bytes. In the illustrated example, the command structure 540 has a two-byte modular command structure (Bytes 1 and 2) with a two-byte column address 542 (Bytes 3-4). A partial structure of the two-byte modular command in FIG. 5C is identical to the two-byte modular command in FIG. 5B with the first byte 502 having a six-bit address 504 for the destination memory device and a two-bit address 506 for the memory bank. The second byte 508 has an eight-bit operation code 510. The two-byte address 542 provides a 16-bit address 544 for a column(s) in the memory bank indicated in the first byte 502. This 16-bit (i.e., two-byte) column address 544 is used for commands for which a column address is required to specify a column location on which the command is to be performed.

The command structures 500, 520 and 540 depend on the command that is being sent to the memory device. As indicated in Table 2, some commands require additional addresses to be supplied with the command (i.e., row or column addresses). Thus, the command structures 500, 520 and 540 depend on the operation code in the second byte 508.

Referring to FIGS. 1 and 5A-5C, the controller 104 translates a request from the host system 102 into one of the command structures 500, 520 and 540 which can then be interpreted by the flash memory devices. Based on the operation code 510, the controller 104 determines whether a row address, column address or no address will be supplied to the memory device. The controller 104 forms the commands that are used by the memory devices 107-0, 107-1 to perform operations.

Each of the command structures 500, 520 and 540 includes both the memory device address 504 and the bank address 506. Thus, processing of commands can be broken up and suspended by different memory devices. Further, since the first byte 502 includes all addressing information, each memory device can assess very quickly whether the command indicated in the second byte 508 is destined for them or is to be passed on to the next memory device.

Although the modular command structures 500, 520 and 540 can be used in any NAND flash memory device, the following examples describe the processing of various commands in the modular command structures 500, 520 and 540 using an HLNAND™ (HyperLink NAND) flash device as am example. The HLNAND™ flash device is described in detail in U.S. Provisional Patent Application No. 60/839,329 filed on Aug. 22, 2006 and incorporated herein by reference.

An exemplary input sequence of the modular commands 500, 520 and 540, depending on the particular command in the operation code, for the HLNAND™ flash device, is shown in Table 3. All commands, addresses and data are shifted in and out of the device, starting with the most significant bit (MSB). In the HLNAND™ flash device, serial data input (SDn) is sampled at the positive or negative clock edge while Serial Data-Input Enable (SDE) is "high". In the particular example shown in Table 3, each command includes one-byte target address represented as "TDA" (the first byte) as per the command structures 500, 520 and 540 shown in FIGS. 5A to 5C and one-byte operation code represented (the second byte). Once SCE goes to logic "high", the one-byte address is shifted in followed by the one-byte operation code. The exception to this is the Write Device Address in which the first byte entering the device is a page read command. Depending on the command, either a three-byte row address represented as "R" in Table 3 or a two-byte column address represented as "C" in Table 3 (the third-fifth bytes). If data is to be provided to the flash device then the data is input into the device after any row or column addresses (as appropriate) and is represented by "D" in Table 3.

TABLE 3

Modular Command Input Sequence

| | Input Byte Number | | | | | | | | |
|---|---|---|---|---|---|---|---|---|---|
| Command | 1$^{st}$ | 2$^{nd}$ | 3$^{rd}$ | 4$^{th}$ | 5$^{th}$ | 6$^{th}$ | 7$^{th}$ | ... 2115$^{th}$ | 2116$^{th}$ |
| Page Read | TDA | 00h | R | R | R | — | — | — | — | — |
| Burst Data Read | TDA | 03h | C | C | — | — | — | — | — | — |
| Page Read for Copy | TDA | 05h | R | R | R | — | — | — | — | — |
| Burst Data Load Start | TDA | 09h | C | C | D | D | D | ... D | D |

TABLE 3-continued

Modular Command Input Sequence

| Command | \<th colspan="8">Input Byte Number |
|---|---|---|---|---|---|---|---|---|---|
| | 1st | 2nd | 3rd | 4th | 5th | 6th | 7th | ... | 2115th | 2116th |
| Burst Data Load | TDA | 0Ah | C | C | D | D | D | ... | D | D |
| Page Program | TDA | 0Fh | R | R | R | — | — | — | — | — |
| Address Input for Block Erase | TDA | 12h | R | R | R | — | — | — | — | — |
| Block Erase | TDA | 17h | — | — | — | — | — | — | — | — |
| Address Input for Page-pair Erase | TDA | 14h | R | R | R | — | — | — | — | — |
| Page-pair Erase | TDA | 1Eh | — | — | — | — | — | — | — | — |
| Read Device Status | TDA | 33h | — | — | — | — | — | — | — | — |
| Read Device ID | TDA | 35h | — | — | — | — | — | — | — | — |
| Write Device Address | 00h | 39h | — | — | — | — | — | — | — | — |
| Write Configuration Register | TDA | 3Ah | D | — | — | — | — | — | — | — |
| Reset | TDA | 3Fh | — | — | — | — | — | — | — | — |

Examples of the operation of the HLNAND™ flash device using the modular command structures 500, 520 and 540 for various operations are described below. The examples below include timing diagrams illustrating processing the memory devices (e.g., the memory devices shown in FIGS. 1-3). The signals in the timing diagrams are shown for the HLNAND™ flash device as an example. The chip enable (CE#) signal indicates that the memory device is enabled when this signal is "low". The serial data input (SDn) signal indicates command, address and input data. The serial data output (SQn) signal indicates a transmission of output data during a read operation. The serial data input enable (SDE) signal controls data input such that when this signal is "high", command address and input data (SDn) are latched into the device. The serial data output enable (SQE) signal enables output (SQn) when this signal is "high".

In a case where device addresses are assigned to all of series-connected devices (e.g., the configuration as shown in FIG. 3) at the start of system operation, the first byte of the command does not need the Write Device Address. The assignment of sequential device addresses is disclosed in U.S. Provisional Patent Application No. 60/787,710, filed Mar. 28, 2006 and U.S. Provisional Patent Application No. 60/802,645, filed May 23, 2006; all of which are incorporated herein by reference in their entirety.

Figure 6A:
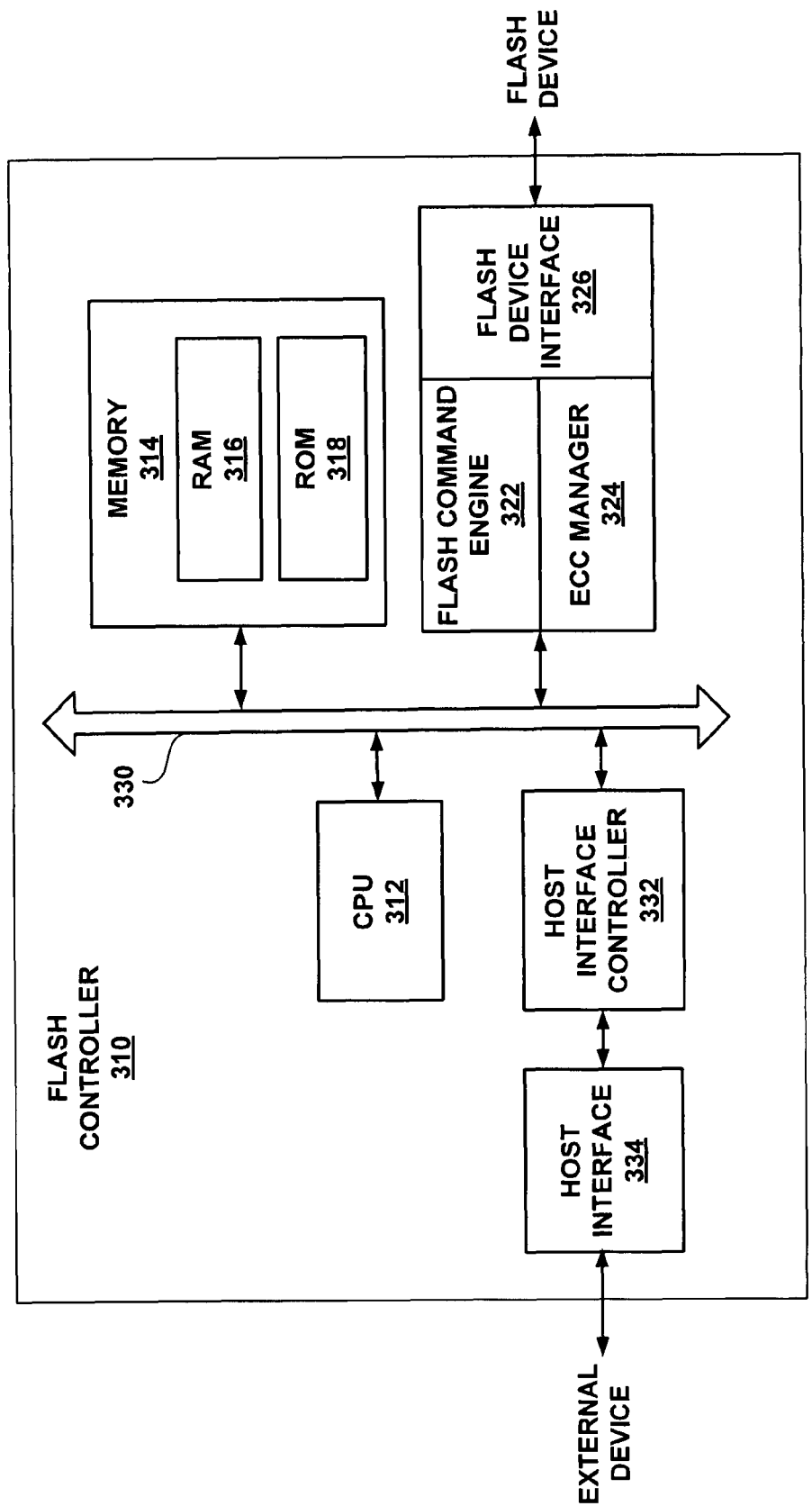
FIG. 6A is a block diagram illustrating a configuration of a flash controller to which embodiments of the present invention is applicable.

FIG. 6A shows an example of a flash controller to which embodiments of the present invention are applicable. The flash controller corresponds to the controllers 104, 112 and 116 shown in FIGS. 1, 2, and 3.

Referring to FIG. 6A, a flash controller 310 includes a central processing unit (CPU) 312; and a memory 314 having a random access memory (RAM) 316 and a read only memory (ROM) 318. Also, the flash controller 310 includes a flash command engine 322, an error correcting code (ECC) manager 324 and a flash device interface 326. Furthermore, the flash controller 310 includes a host interface controller 332 and a host interface 334. The CPU 312, the memory 314, the flash command engine 322 and the host interface controller 332 are connected through a common bus 330. The host interface 334 is for connection to an external device through a bus, connection links, interface or like (e.g., ATA (Advanced Technology Attachment), PATA (Parallel ATA), SATA (Serial ATA), USB (universal serial bus). The host interface 334 is controlled by the host interface controller 332. The CPU 312 operates with instructions stored in the ROM 318 and processed data is stored in the RAM 316. The flash command engine 322 interprets the commands and the flash controller 310 controls the operations of the flash devices through the flash device interface 326. The ECC manager 324 generates an ECC and the ECC verification is conducted. In a case of an error, an error message is generated. The flash controller 310 can be configured as a system on chip, system in package or multiple chips.

Figure 6B:
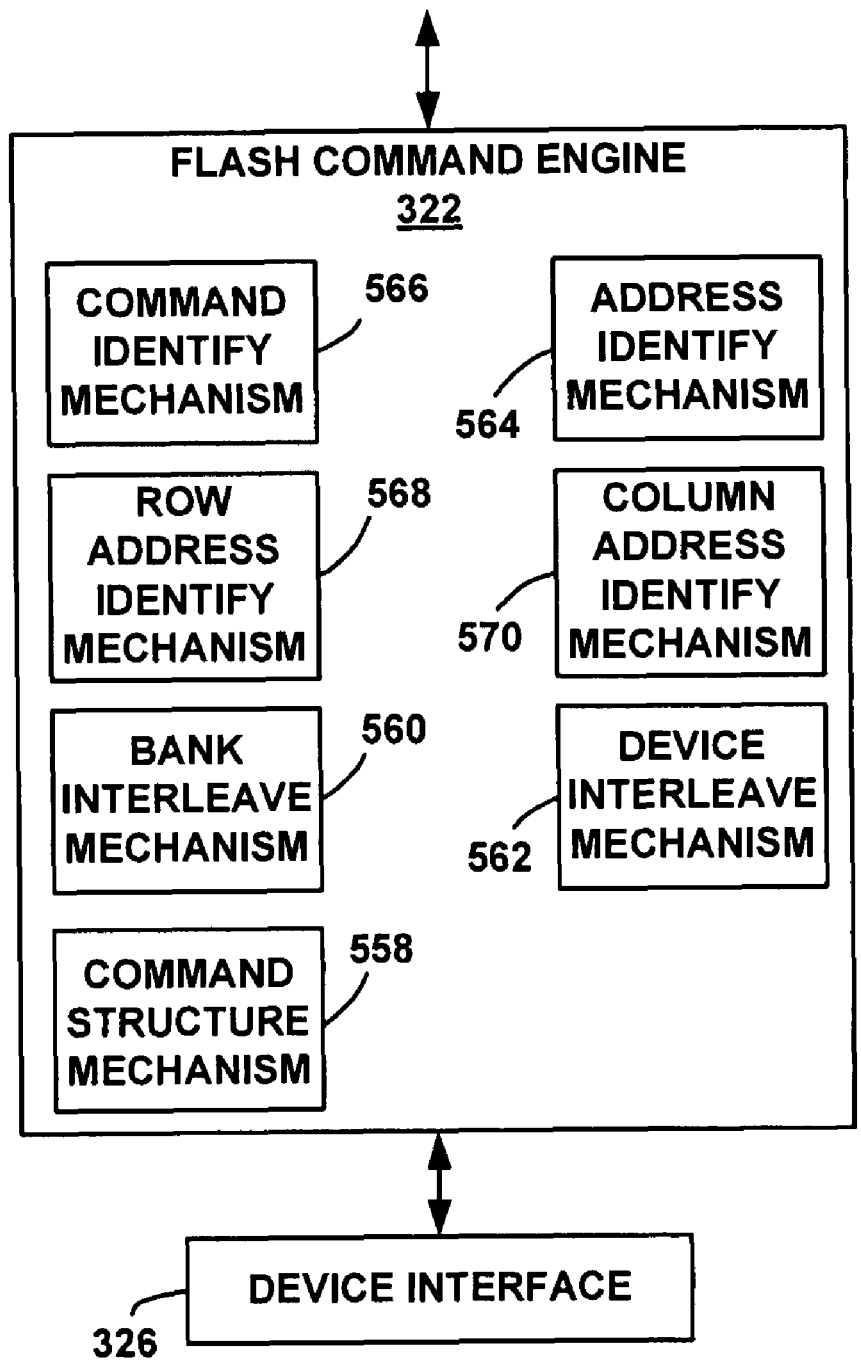
FIG. 6B is a block diagram illustrating an example of functional components of a flash command engine shown in FIG. 6A.

FIG. 6B shows an example of functional components of the flash command engine 322 of FIG. 6A, when issuing a command to flash devices. Referring to FIGS. 1, 6A and 6B, the flash command engine 322 interprets the requests from the host system 102 into a plurality of separatable commands that are interpretable by the flash memory device. Thus, the flash controller 310 translates a request for access to flash memory device into at least one command using the modular command structure shown in FIGS. 5A to C. The flash controller 310 includes a connection with the bus 330 connected to the host interface controller 332. The connection enables communication with the host system 102 for receiving requests from the processor 103 of the host system 102 for access to the flash memory device. The flash controller 310 also includes the flash device interface 326 in communication with the flash memory device. The flash device interface 326 acts as another connection for issuing commands to the flash memory devices of the memory system.

The flash command engine 322 includes a command structure mechanism 558, a bank interleave mechanism 560, a device interleave mechanism 562, an address identify mechanism 564, a command identify mechanism 566, a row address identify mechanism 568, and a column address identify mechanism 570. The command structure mechanism 558 processes the modular command structures to be used by the memory devices (e.g., the modular command structures shown in FIGS. 5A to C). The address identify mechanism 564 and the command identify mechanism 566 analyze the request from the host system 102 to extract the memory device and/or bank address and the command, respectively, therefrom. The command identify mechanism 566 determines that multiple commands are to be used to implement the request. Each of the commands is separatable and in combination effects the request from the host system 102. The command identify mechanism 566 gathers the information to formulate the command, including the address from the address identifying mechanism 564. If any of the commands that form the request respects a row or column address then the command identify mechanism 566 enlists the use of the row address identify mechanism 568 or the column address identify mechanism 570, respectively, to obtain the row or column address that form part of the command.

The bank interleave mechanism 560 and the device interleave mechanism 562 order multiple commands being send through the device interface 326 to multiple memory banks or memory devices, respectively. The modular command structure is configured so that a flash memory device having multiple memory banks can have each memory bank processing simultaneously. Likewise, the modular command structure is configured so that the series-connected memory devices can be simultaneously processing. The bank interleave mechanism 560 interleaves commands for different memory banks in the same memory device (see FIGS. 16-21 for examples of concurrent operations in multiple memory banks). The device interleave mechanism 562 interleaves commands for different memory devices in the same memory system (see FIGS. 22-28).

The EEC manager 324 generates an error correcting code (ECC) to verify that certain commands have been performed successfully and completely.

FIG. 6B illustrates the functional components of the flash command engine 322 and may be realized in a number of configurations that will be recognized by a person of skill in the art.

The modular command can include a Page Read command. With a modular command structure the first cycle of the Page Read command is input followed by a column address for the start column address in a target page address and a row address for the target page address. The second cycle of the Page Read command is input after which the device is busy for a time period (e.g., 20 µs) for completion of the internal page read operation. After such a wait time period, a Burst Data Read operation is performed to retrieve the data from buffers of the device. From the time this operation starts until the Burst Data Read is finished, the device cannot perform any other operations.

Figure 7:
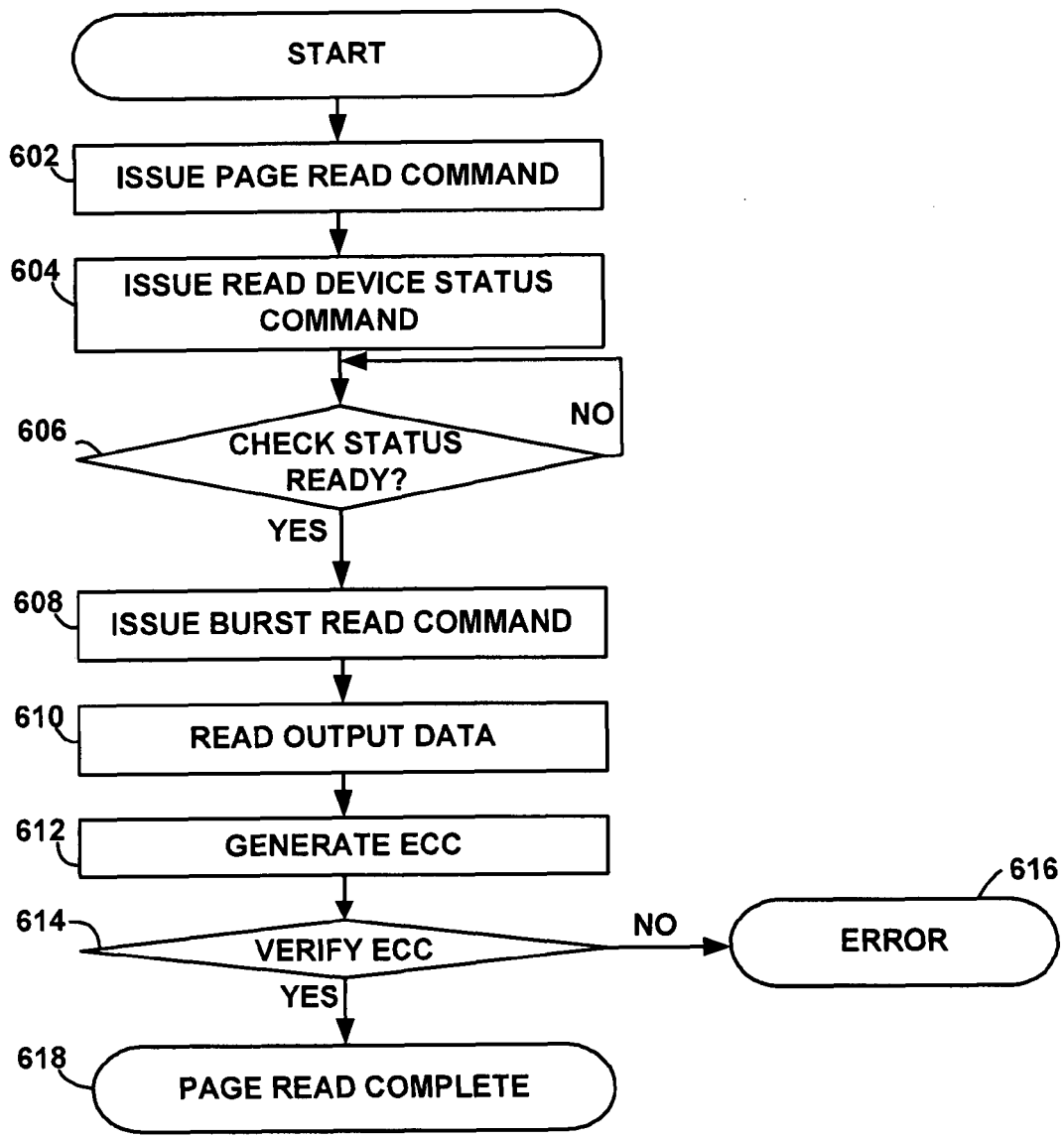
FIG. 7 is a flow chart illustrating a process conducted by a Page Read command from the controller using the modular command structure.

FIG. 7 shows a flow of the Page Read command. The controller for the system generates a Page Read command in step 602 including a destination flash device address, a memory bank address, the Page Read operation code and a three-byte row address for the row(s) defining the page to be read. The Page Read command is passed through the flash devices forming the system until the destination flash device address matches the flash device receiving the Page Read command. The Page Read command including the row address(es) is received by the destination flash device. The Page Read command is provided to the command register of the destination flash where the address latch cycles are then started to enter the three-bytes of row address. Once the address latch cycles are finished, the Page Read operation is started in the flash device and the data in the selected page is sensed and transferred to the data registers in less than time $t_R$ (transfer time from memory bank to data registers, e.g., 20 µs).

The controller either waits for $t_R$ to collect the data from the page or the controller generates and sends a device status inquiry to the flash device to receive a notification when the page has been accessed. In the case where the controller generates a device status command, the command is sent to the flash device in step 604. The flash device will response to this request with a continuous busy indication until the page has been accessed, at which time the flash device indicates that the memory bank is ready and no longer busy. The controller continuous checks to determine whether the memory bank is ready in step 606.

Once the memory bank is ready, or if the controller waits for $t_R$, a Burst Data Read command with the device address and the column address is then issued in step 608. If the controller does not send a device status inquiry and waits for $t_R$ instead, then steps 604 and 606 are not performed. Once the device receives the Burst Data Read then the SQE signal is enabled and the page data in the data registers is read out in step 610 starting from the column address given with the command. This reading continues via SQn until SQE goes low.

An error correcting code (ECC) is generated by the controller in step 612 and verified in step 614. If the ECC cannot be verified then an error message is issued in step 616. If the ECC is verified then the Page Read operation was successful and the operation is completed in step 618. For example, the flash device controller generates ECC parity bits for 2048 byte input data per page. Thus, 2048 byte data with ECC parity bits are programmed (typically one-byte ECC per 512 bytes, total four byte ECC per 2048 bytes in a page). The ECC parity bits are programmed in 64 bytes spare field in a page. During the page read, the flash device controller reads 2048 bytes data with ECC parity information. The flash device controller verifies the 2048 data with four byte ECC information. Therefore, the ECC process is performed by the flash device controller and the flash memory devices store only ECC parity information.

Figure 8:
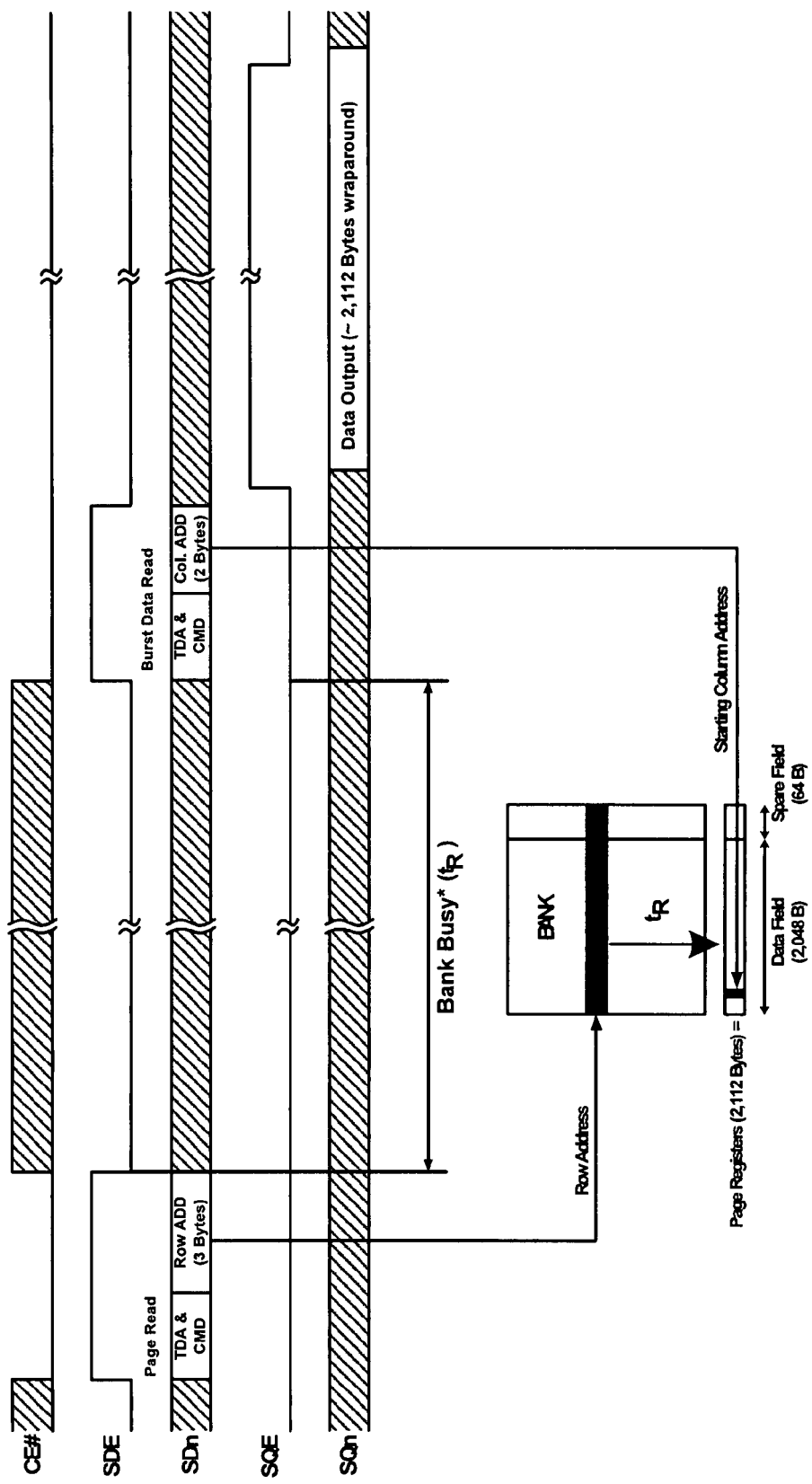
FIG. 8 illustrates a timing of a Page Read operation with a set wait period from the flash memory device using the modular command structure.

FIG. 8 illustrates a timing diagram for a Page Read operation from the perspective of the flash device where the controller waits for the expiration of $t_R$ to obtain the requested data. If the Burst Data Read command is issued and SQE is enabled during the Bank Busy period $t_R$, all output data will be invalid.

Figure 9:
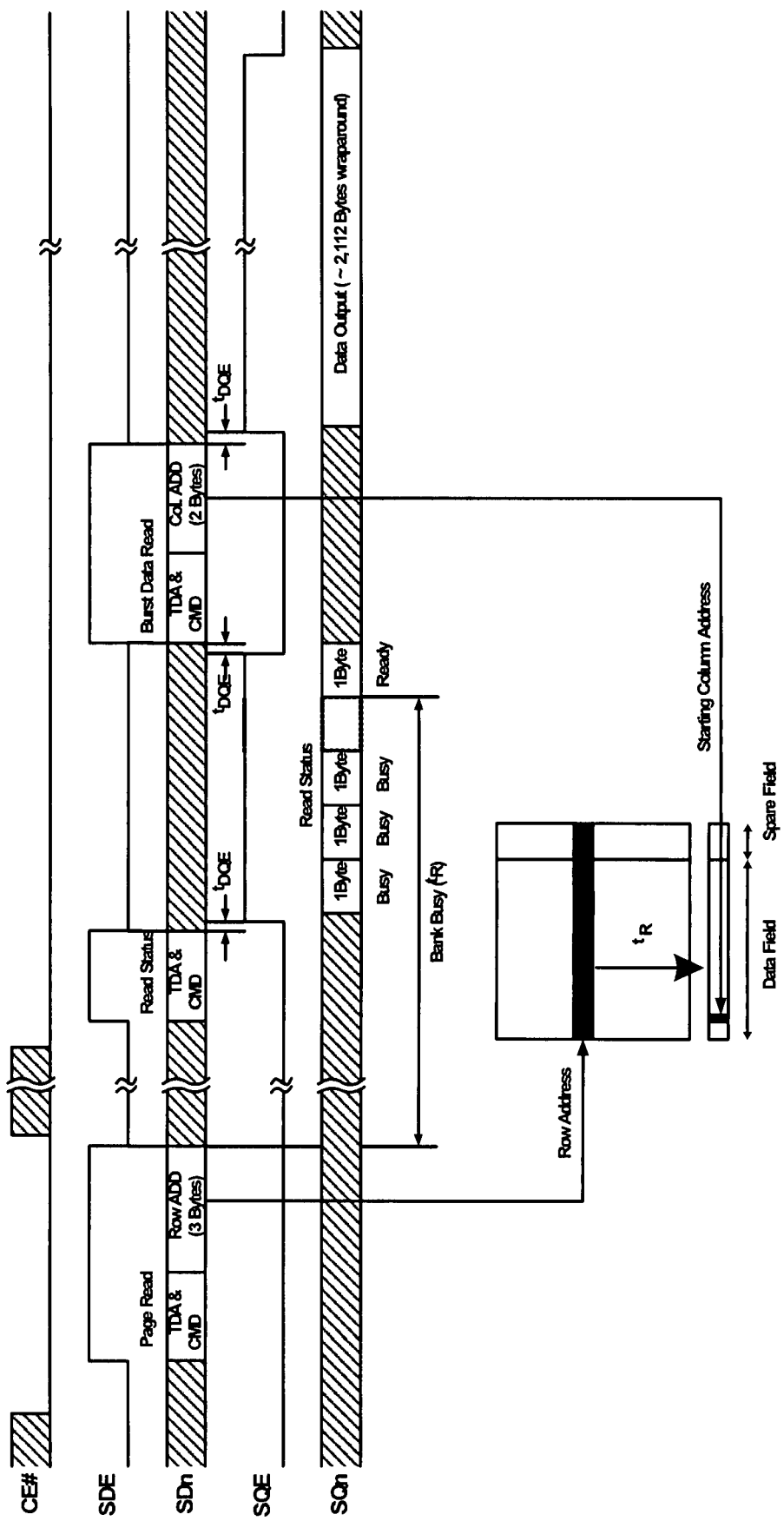
FIG. 9 illustrates a timing of a Page Read operation from the flash memory device with a status request using the modular command structure.

FIG. 9 illustrates a timing diagram for a Page Read operation with a device status from the controller from the perspective of the flash device.

The modular command can include a Page Program command. With a modular command structure the first cycle of the Page Program command is input followed by a column address for the start column address in a target page address and a row address for the target page address. The input data is then loaded followed by the second cycle of the page program command. The device is busy for a time period (e.g., 200 µs) after the second cycle during completion of an internal Page Program operation. These steps are all considered as one procedure that cannot be interrupted if the Page Program operation is to be completed.

Figure 10:
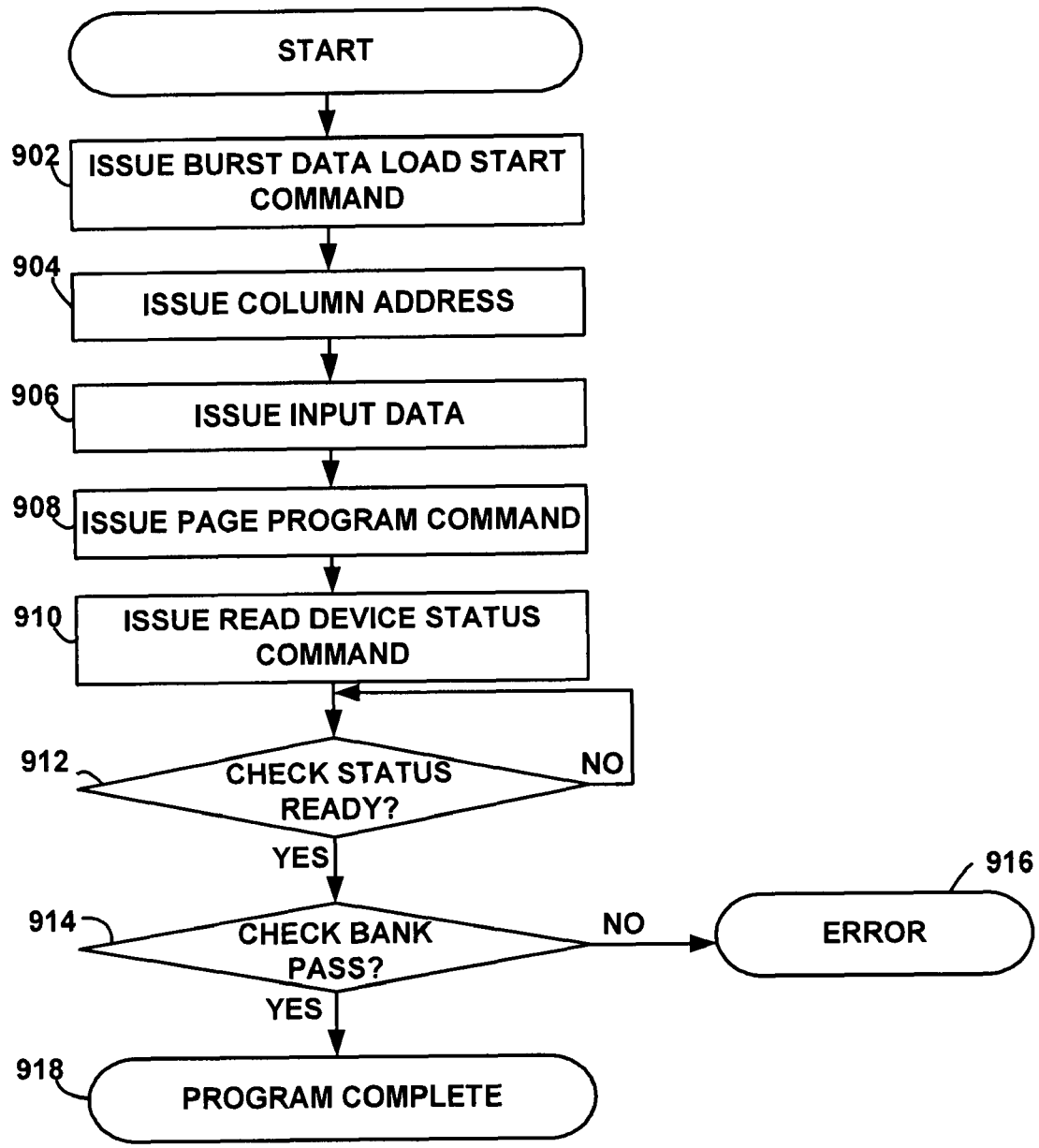
FIG. 10 is a flow chart illustrating a process conducted by a Page Program command from the controller using the modular command structure.

FIG. 10 illustrates a flow of a Page Program command from the flash device controller. The controller for the system generates a Burst Data Load Start command in step 902 including a destination flash device address, a memory bank address, the Burst Data Load Start operation code and a two-byte column address for the column(s) that are to be programmed. The Burst Data Load Start command is passed through the flash devices forming the system until the destination flash device address matches the flash device receiving the Burst Data Load Start command. The Burst Data Load Start command is provided to the command register of the destination flash device along with the two-byte columns address in step 904 and then the input data in step 906. The Burst Data Load Start command resets all data registers in the destination flash device. If the Burst Data Load Start operation did not input all data into the flash device then subsequent Burst Data Load commands may be used to place all data in the device.

The flash device controller generates a Page Program command in step 908 again specifying the destination device address and the memory bank address as well as the Page Program operation code and a row address(es) that specify the rows that will be written in the Page Program operation. The Page Program command is generated by the controller a time $t_{DDE}$ after the data has been loaded into the flash device from the Burst Data Load Start command. This will program the loaded data into the selected page location.

The controller uses a Device Status command issued in step 910 to monitor the status of the Page Program operation.

The flash device will respond to this request with a continuous busy indication until the page has been accessed, at which time the flash device indicates that the memory bank is ready and no longer busy. The controller continuous checks to determine if the memory bank is ready in step 912. Once the memory bank is ready the controller checks to see is the Page Program operation was successful. If not then an error is output in step 916, otherwise, the Page Program operation is completed in step 918.

Figure 11:
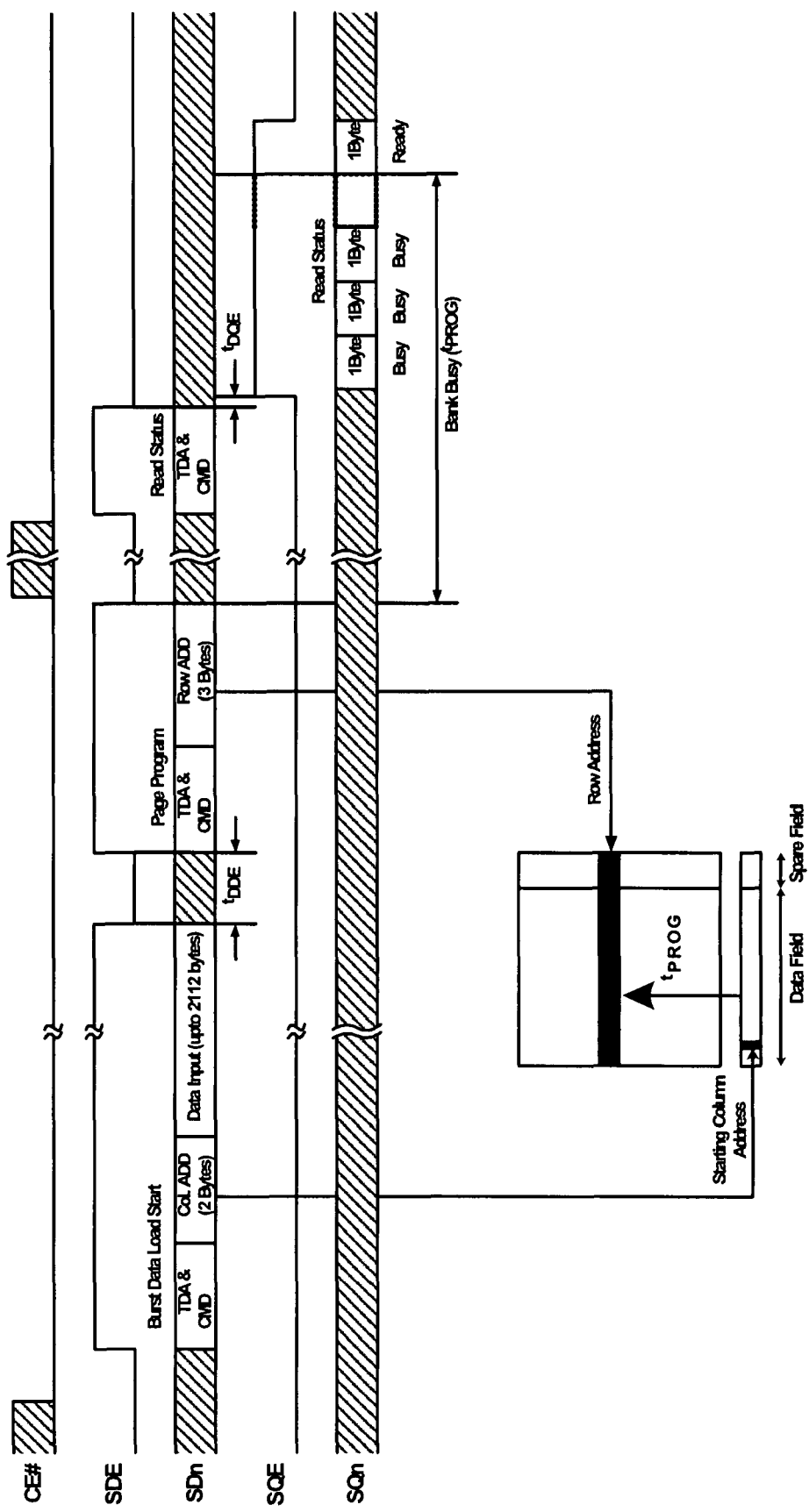
FIG. 11 illustrates a timing of a Page Program operation from the flash memory device with a single data input using the modular command structure.
Figure 12:
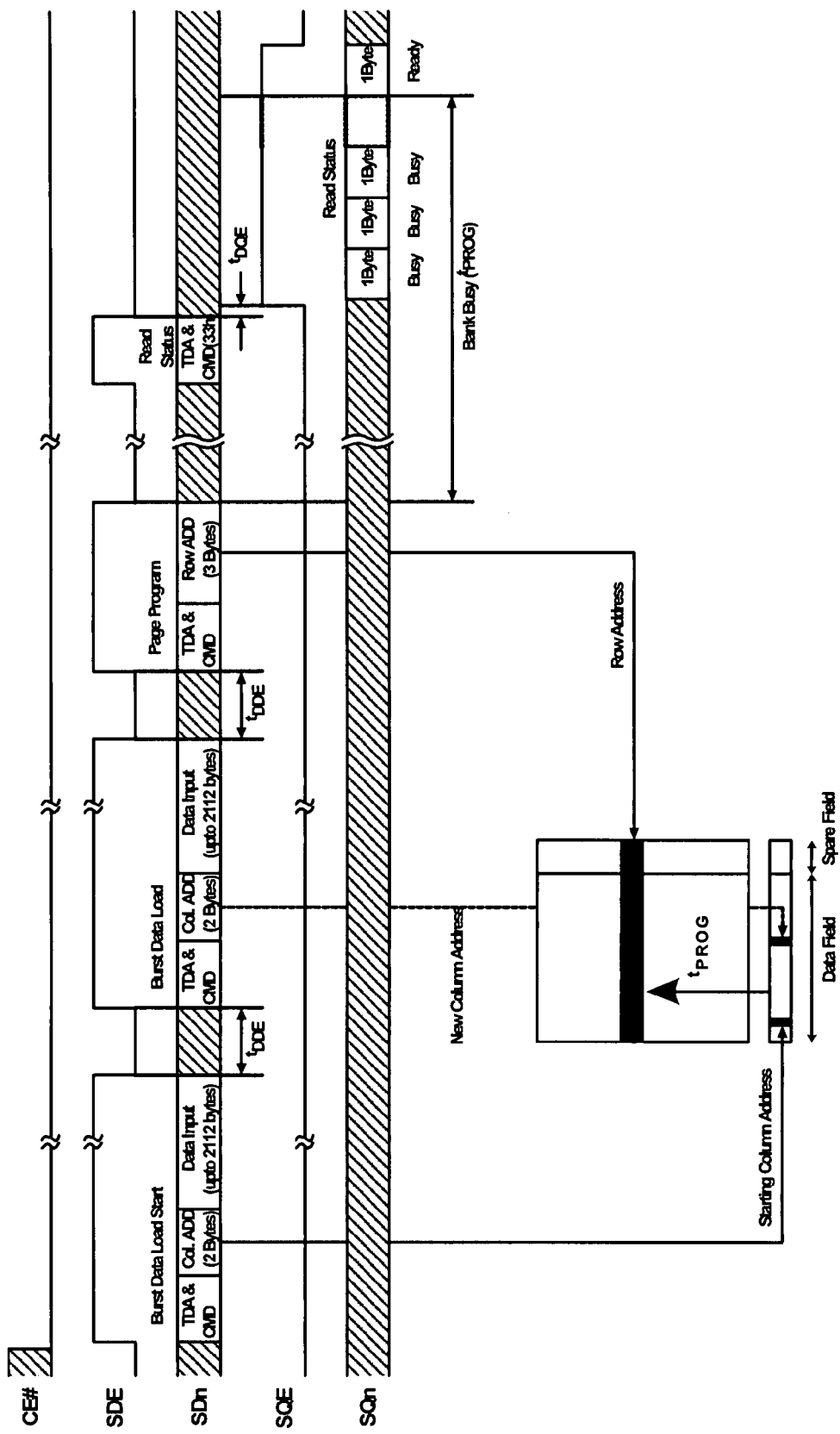
FIG. 12 illustrates a timing of a Page Program operation from the flash memory device with two data inputs using the modular command structure.

FIG. 11 illustrates a timing diagram for a Page Program operation from the perspective of the flash device where the Burst Data Load Start is sufficient to load all data into the device. FIG. 12 illustrates a timing diagram for a Page Program operation where a Burst Data Load operation is required after the Burst Data Load Start operation in order to load all data into the device.

The modular command can include a Block Erase command. With a command structure the first cycle of the Block Erase command is input followed by a row address for the target block address. The second cycle of the Block Erase command is input after which the device is busy for 1.5 ms to complete the internal block erase operation.

Figure 13:
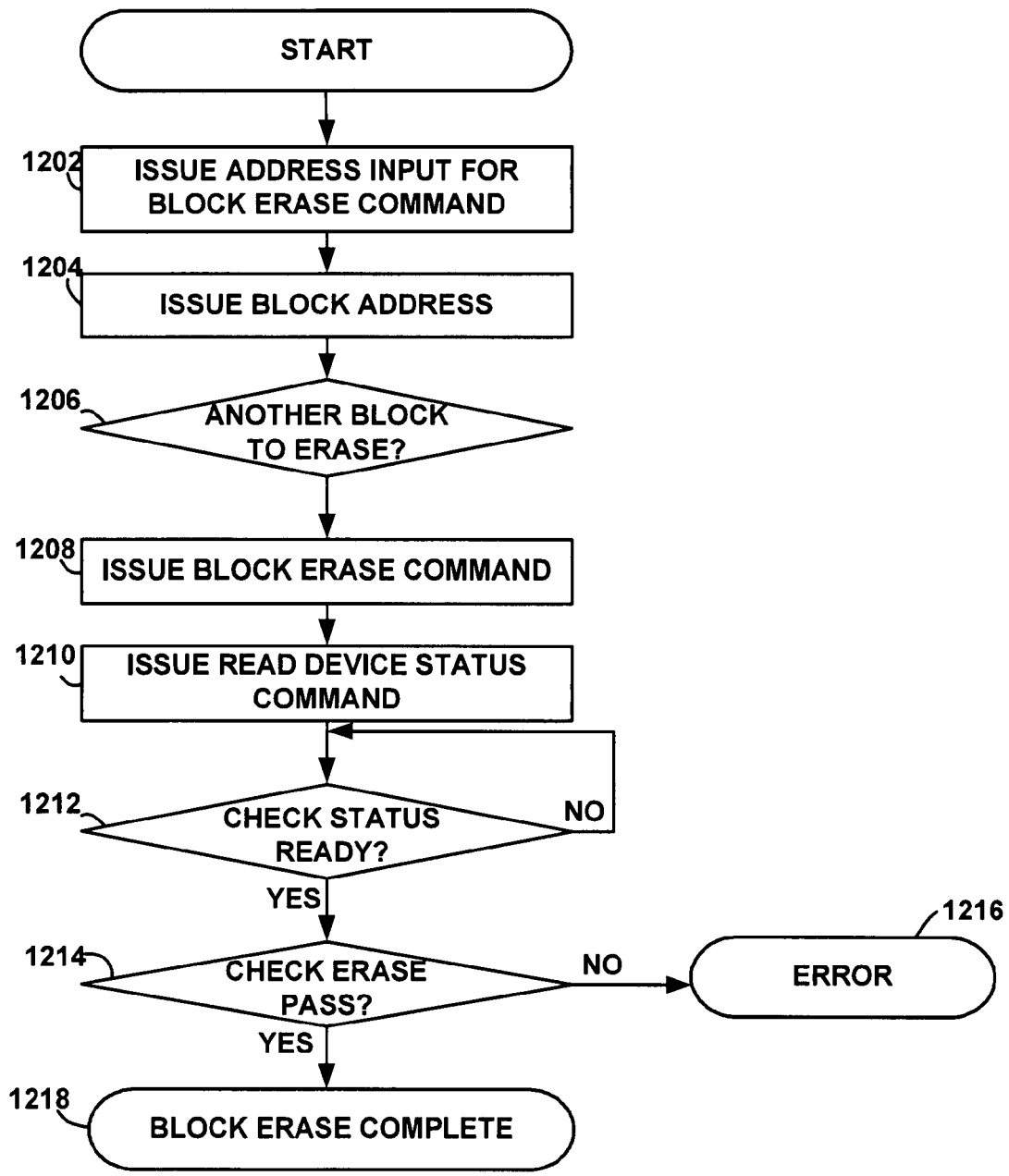
FIG. 13 is a flow chart illustrating a process conducted by a Block Erase command from the controller using the modular command structure.

FIG. 13 is a flow of a Block Erase operation from the controller. The flash device controller for the system generates an Address Input for Block Erase command in step 1202 including a device address, a memory bank address, an operation code and a three-byte row address in step 1204. If more than one block is to be erased at a time in step 1206 then additional Address Input for Block Erase commands are generated by the controller to specify these additional blocks. When all blocks have been specified, the controller generates a Block Erase command in step 1208 to start the flash device performing the Block Erase operation for the selected blocks. The Block Erase command generated by the controller includes the device address, the memory bank address and the operation code.

The controller issues a Status command in step 1210 that is used to determine when the memory bank is available and the Block Erase operation is completed. The controller continuously checks in step 1212 on the device status until the memory bank is available. When Block Erase operation is complete, the controller checks to see if the operation was successful in step 1214. If the operation was not successful then an error is issued in step 1216, otherwise the Block Erase operation is completed in step 1218.

Figure 14:
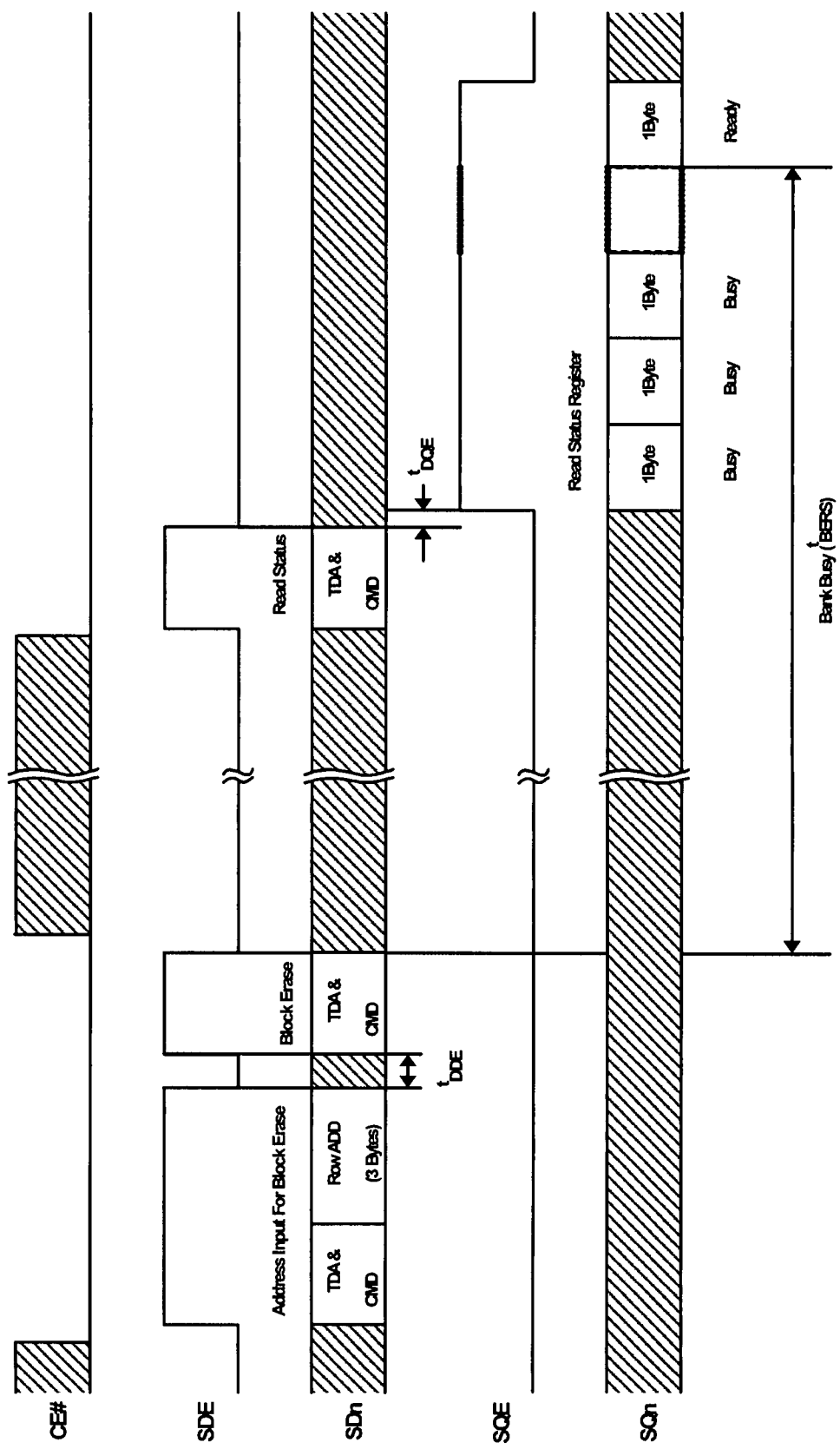
FIG. 14 illustrates a timing of a Block Erase operation with a single block address to erase from the flash memory device using the modular command structure.
Figure 15:
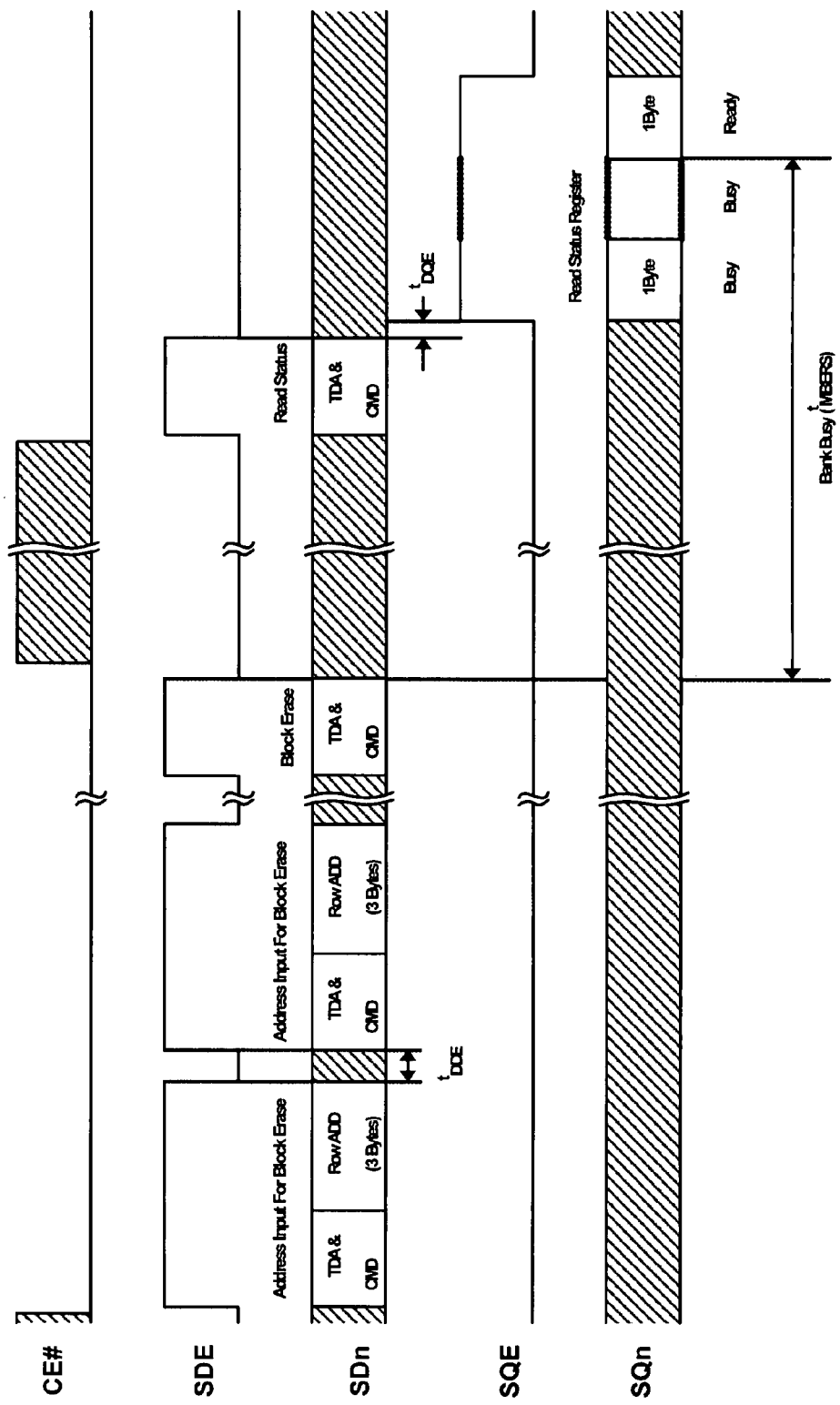
FIG. 15 illustrates a timing of a Block Erase operation with two block addresses to erase from the flash memory device using the modular command structure.

FIG. 14 illustrates a timing diagram for a Block Erase operation from the perspective of the flash device where only a single block is being erased. FIG. 15 illustrates a timing diagram for a Block Erase operation where multiple blocks are being erased.

The modular command structures illustrated in FIGS. 5A to C provide for a memory bank address to be supplied in the first byte along with the device address. This memory bank address is used in circumstances where the flash memory device has more than one memory bank to specify the memory bank to which the command is directed. Since a command with the modular command structure specifies the memory bank address in the command, a flash device having a configuration in which each memory bank operates independently, will be able to have operations being performed on more than one of the memory banks in the flash device at a time. The HLNAND™ flash device is an example of one such flash memory.

The pin configuration of multiple HLNAND™ flash devices that are cascaded at the top level may be identical to one of the single devices. With a serial interconnection configuration, each device introduces an additional half clock cycle latency, for example, on a cascading path. As such, the number of cascaded devices determined a total clock latency of operations in the serial interconnection configuration. With a configuration of multiple devices having multiple memory banks interconnected, the controller can effectively schedule many different procedures that are accessing time consuming core operations by interleaving the commands.

FIGS. 16 to 21 illustrate concurrent operations being performed on two memory banks in a single flash memory device.

Figure 16:
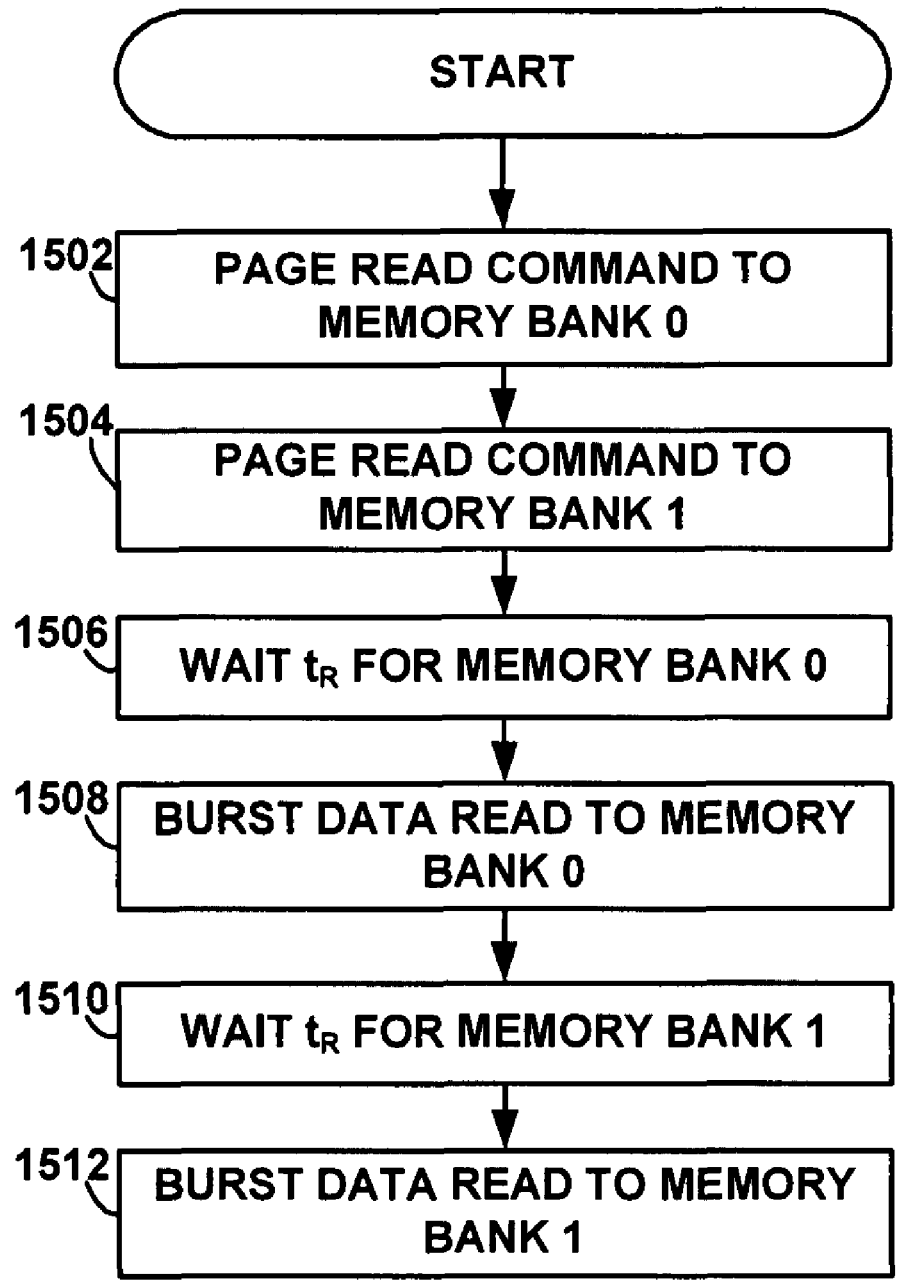
FIG. 16 is a flow chart illustrating a process conducted by concurrent Page Read commands from the controller for two memory banks in the same flash memory device using the modular command structure.

FIG. 16 illustrates a flow for a concurrent Page Read operation from two memory banks in the same flash memory device. A Page Read command is given to memory bank 0 in step 1502. Memory bank 0 then proceeds to process the request by accessing the requested page. While memory bank 0 is processing the Page Read command, a second Page Read command is given to memory bank 1 in step 1504. Memory bank 1 then proceeds to process the request by accessing the requested page while memory bank 0 is concurrently processing its own request. A time $t_{R1}$ after the Page Read request is given to memory bank 0 is then allowed to elapse in step 1506 before a Burst Data Read command is given to memory bank 0 in step 1508 to access the data resulting from the Page Read command issued in step 1502. A time $t_{R2}$ after the Page Read request is given to memory bank 1 is allowed to elapse in step 1510 before a Burst Data Read command is given to memory bank 1 in step 1512 to access the data resulting from the Page Read command issued in step 1504.

Figure 17:
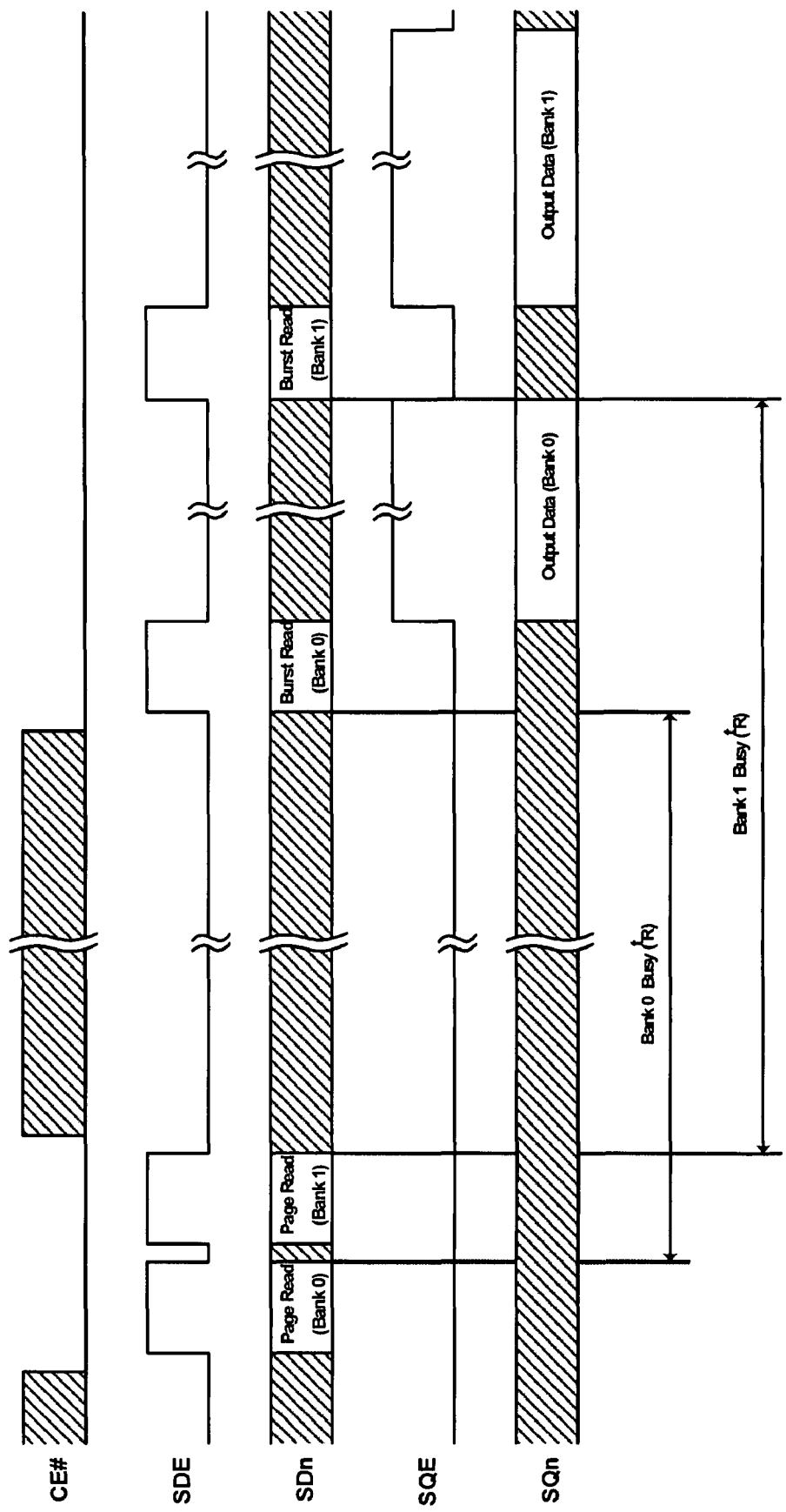
FIG. 17 illustrates a timing from the flash memory of concurrent Page Read operations for two memory banks in the same flash memory device using the modular command structure.

FIG. 17 illustrates a timing of the concurrent Page Read operation illustrated in FIG. 16.

Figure 18:
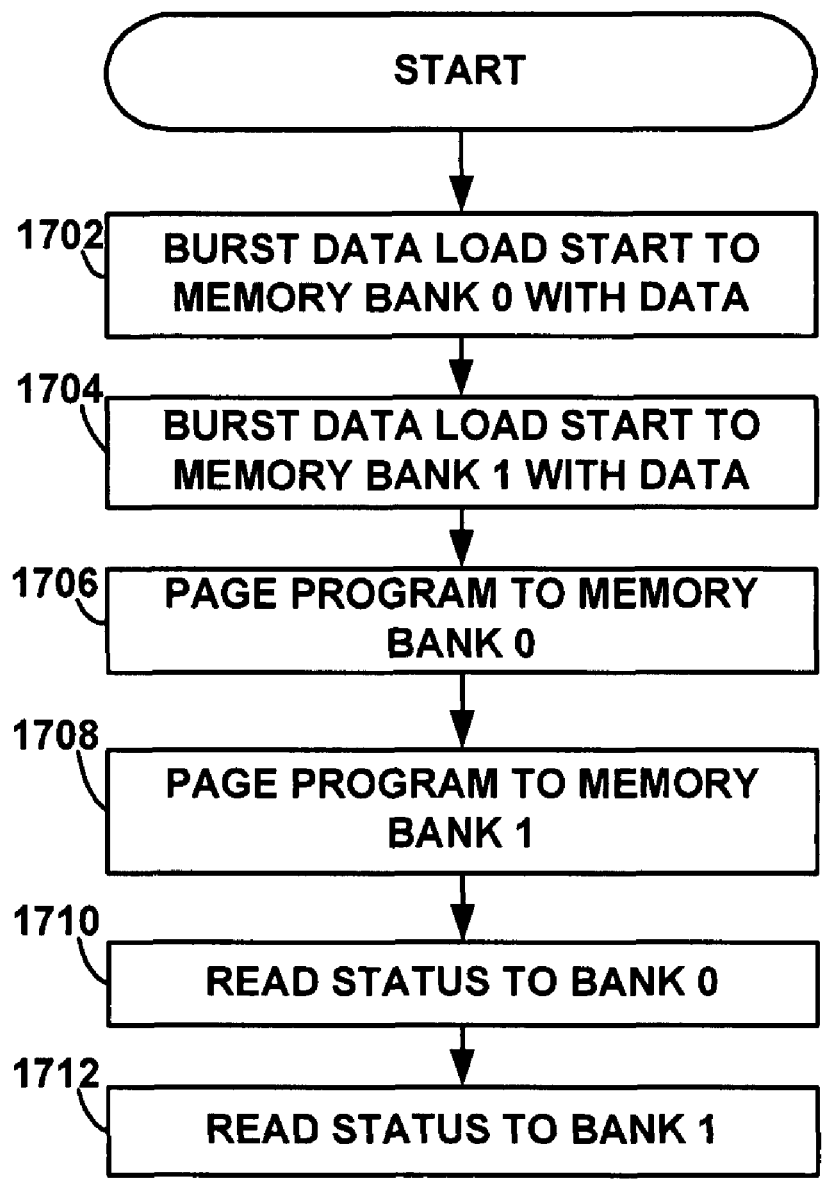
FIG. 18 is a flow chart illustrating a process conducted by concurrent Page Program commands from the controller for two memory banks in the same flash memory device using the modular command structure.

FIG. 18 illustrates a flow for a concurrent Page Program operation in two memory banks of the same flash memory device. A Burst Data Load Start command is given to memory bank 0 in step 1702 along with data to be programmed into memory bank 0. A Burst Data Load Start command is given to memory bank 1 in step 1704 along with data to be programmed into memory bank 1. A Page Program command is given to memory bank 0 in step 1706 and a Page Program command is given to memory bank 1 in step 1708. Read Status commands are given to memory bank 0 in step 1710 and memory bank 1 in step 1712 to monitor the progress of each memory bank in completing the Page Program operation. When the status returns a pass for each memory bank then the Page Program operations are complete and other operations can be performed by the memory banks.

Figure 19:
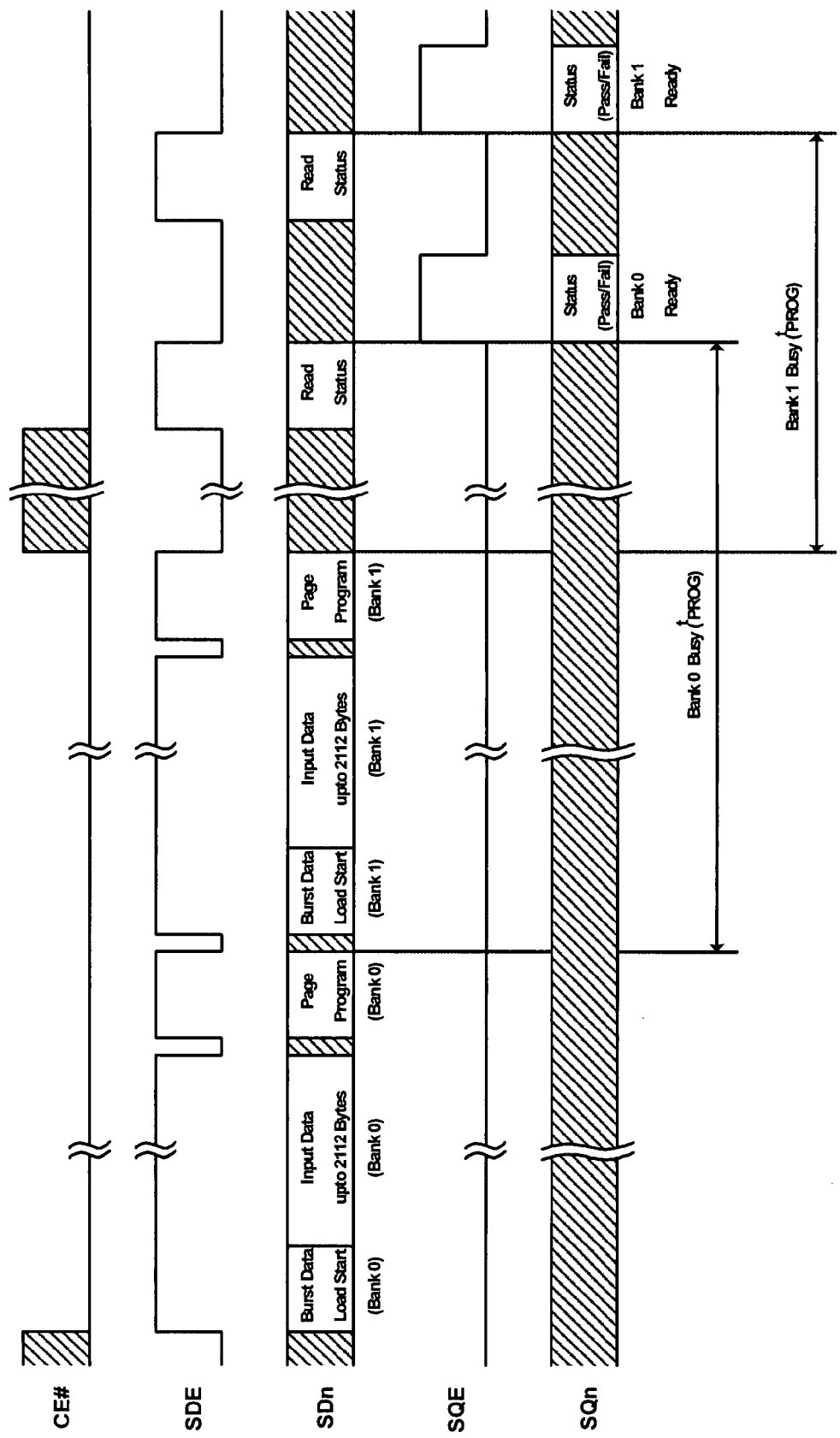
FIG. 19 illustrates a timing from the flash memory of concurrent Page Program operations for two memory banks in the same flash memory device using the modular command structure.

FIG. 18 shows the Burst Data Load Start command being given to each memory bank before the Page Program command was provided to each bank. The Burst Data Load Start and the Page Program command may both be given to memory bank 0 before either of the commands is given to memory bank 1. FIG. 19 illustrates a timing of the concurrent Page Program operation in which the Burst Data Load Start and the Page Program command are given to memory bank 0 before either of the commands is given to memory bank 1.

Figure 20:
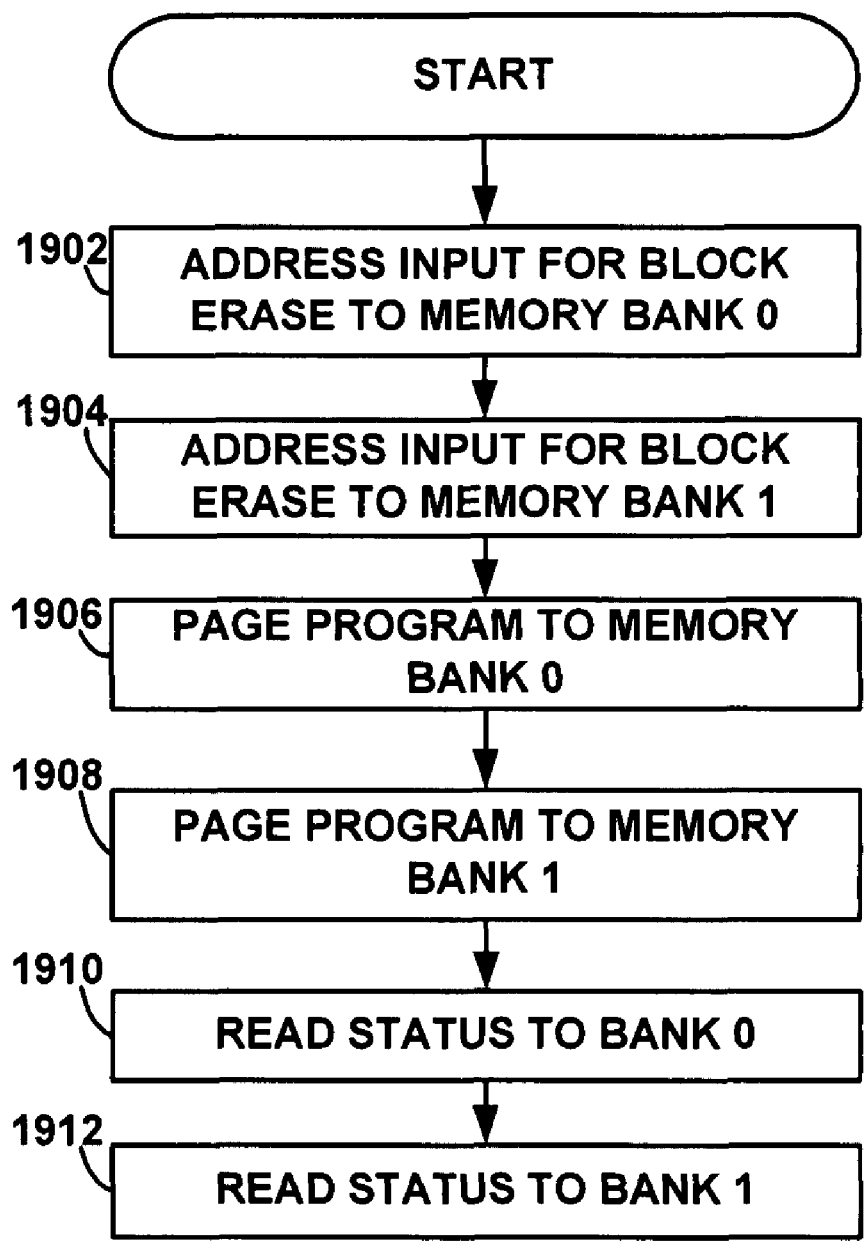
FIG. 20 is a flow chart illustrating a process conducted by concurrent Block Erase commands from the controller for two memory banks in the same flash memory device using the modular command structure.

FIG. 20 illustrates a flow for a concurrent Block Erase operation in two memory banks of the same flash memory device. An Address Input for Block Erase command is given to memory bank 0 in step 1902 along with the address of the block to be erased. An Address Input for Block Erase command is given to memory bank 1 in step 1904 along with the address of the block to be erased. A Block Erase command is provided to memory bank 0 in step 1906 upon receipt of which the block indicated in the Address Input for Block Erase command received in step 1902 is erased. A Block Erase command is provided to memory bank 1 in step 1908 upon receipt of which the block indicated in the Address Input for Block Erase command received in step 1904 is erased. A Read Status command is given to memory bank 0 in step 1910 and also to memory bank 1 in step 1912 to monitor the progression of the Block Erase operation. When the status returns a pass for each memory bank then the Block Erase operations are complete and other operation can be performed by the memory banks.

Figure 21:
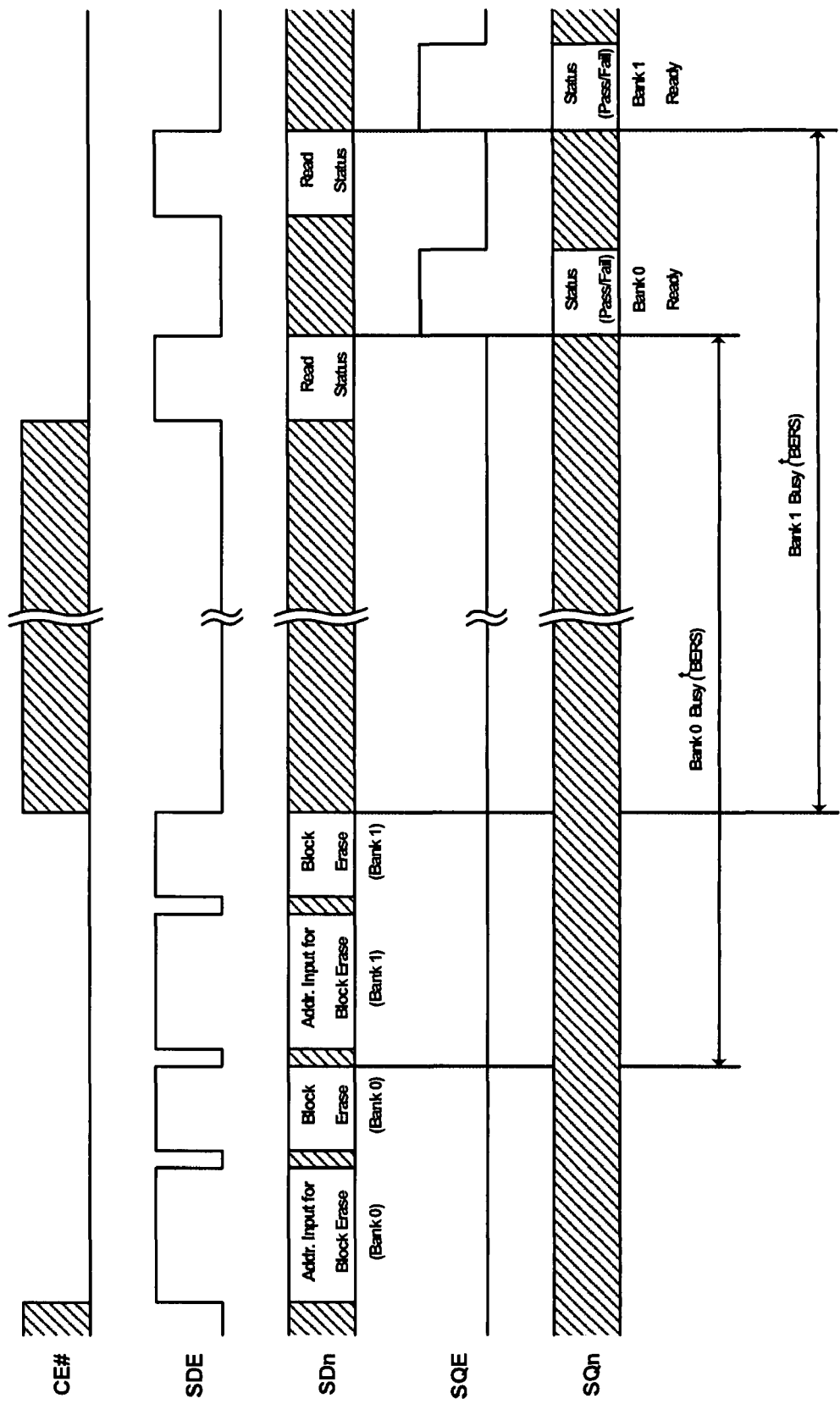
FIG. 21 illustrates a timing from the flash memory of concurrent Block Erase operations for two memory banks in the same flash memory device using the modular command structure.

FIG. 20 shows the Address Input for Block Erase command being given to each memory bank before the Block Erase command was provided to each bank. The Address Input for Block Erase and the Block Erase command may both be given to memory bank 0 before either of the commands is given to memory bank 1. FIG. 21 illustrates a timing of the concurrent Block Erase operation in which the Address Input for Block Erase and the Block Erase command are given to memory bank 0 before either of the commands is given to memory bank 1.

The operations that are concurrently performed by the memory banks are not necessarily the same operation. FIGS. 22 to 25 illustrate different operations being performed concurrently by two memory banks of the same flash memory device.

Figure 22:
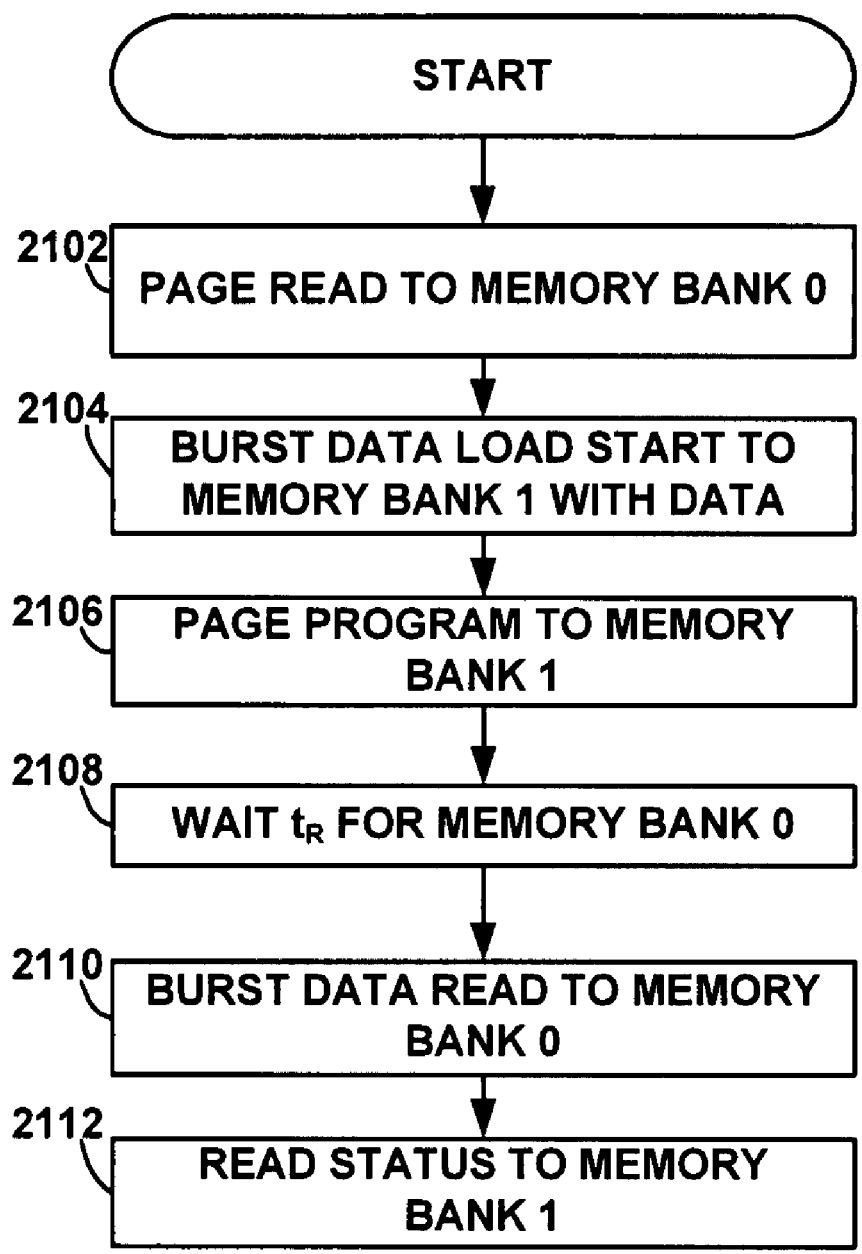
FIG. 22 is a flow chart illustrating a process conducted by interleaved Page Read and Page Program commands from the controller for two memory banks in the same flash memory device using the modular command structure.

FIG. 22 illustrates a flow for concurrent Page Read and Page Program operations in two memory banks of the same flash memory device. A Page Read command is given to memory bank 0 in step 2102. While memory bank 0 is accessing the page indicated in the Page Read command, a Burst Data Load Start command is given to memory bank 1 in step 2104 along with data that is to be programmed into memory bank 1. A Page Program command is given to memory bank 1 in step 2106 to start programming of the data into memory bank 1. A time $t_R$ is allowed to elapse in step 2108 after the Page Read command is given in step 2102 to allow memory bank 0 to retrieve the requested data before a Burst Data Read command is given in step 2110 to memory bank 0 to access the data retrieved from the Page Read operation. A Read Status command is given to memory bank 1 in step 2112 to monitor the progression of the Page Program operation. When the status returns a pass for memory bank 1 then the Page Program operation is complete and other operations can be performed by memory bank 1.

Figure 23:
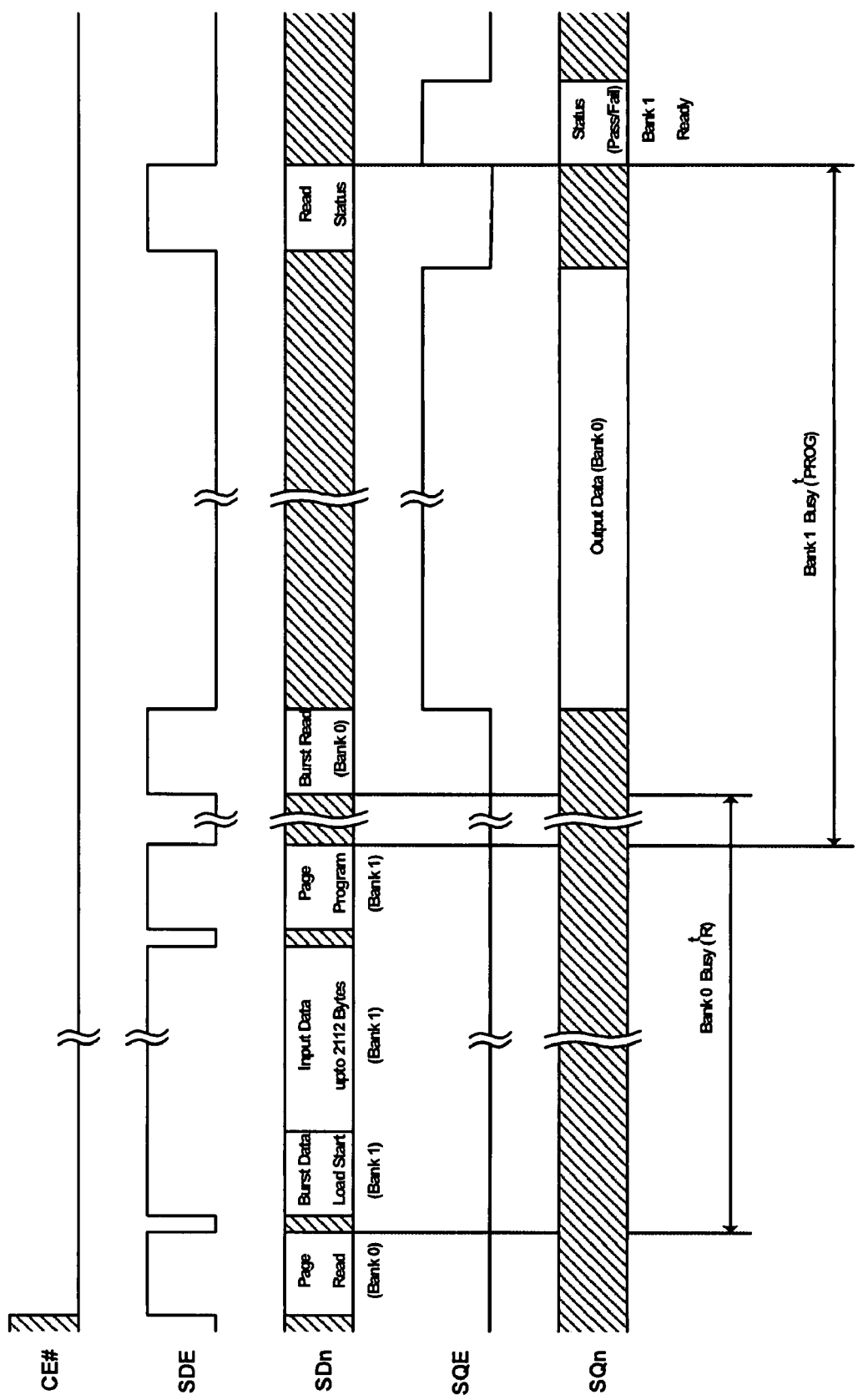
FIG. 23 illustrates a timing from the flash memory device of interleaved Page Read and Page Program operations for two memory banks in the same flash memory device using the modular command structure.

FIG. 23 illustrates a timing of the concurrent Page Read and Page Program operations from FIG. 22.

Figure 24:
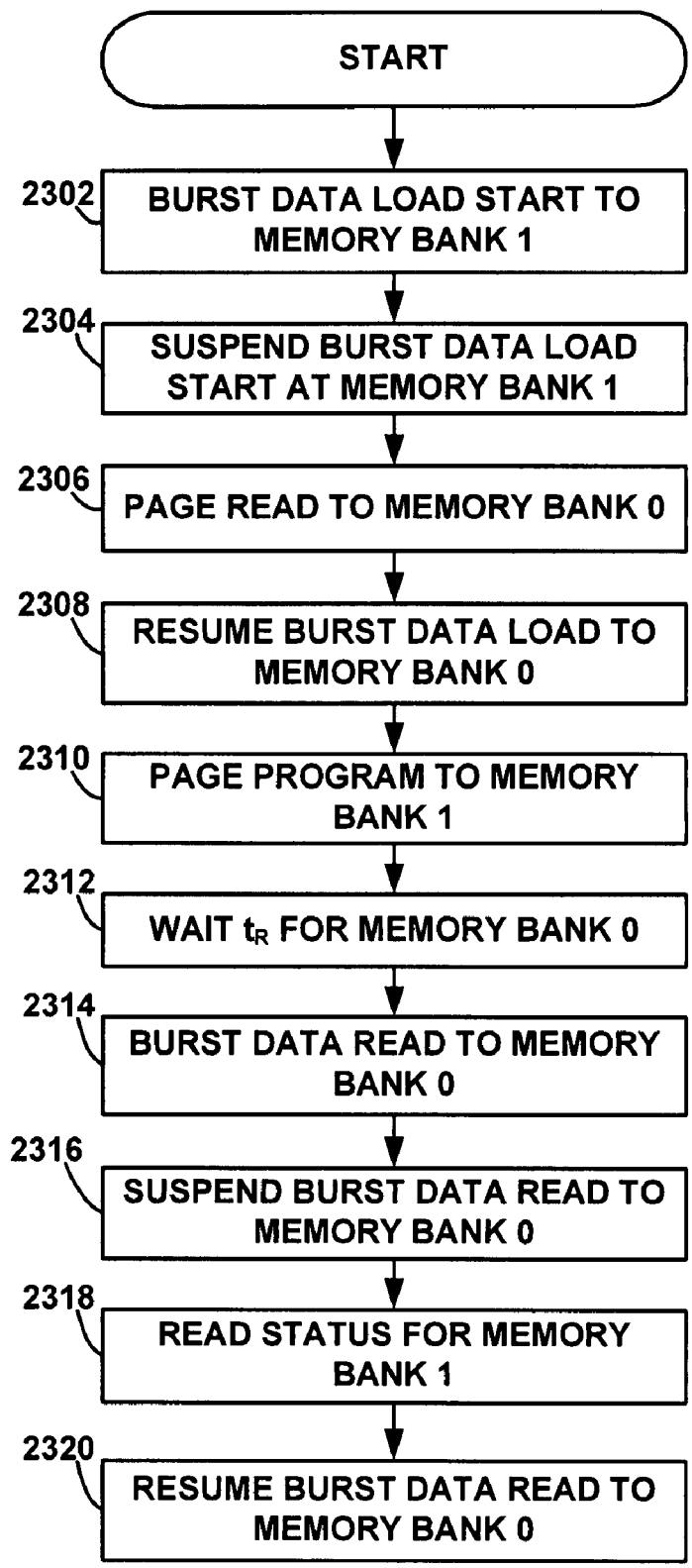
FIG. 24 is a flow chart illustrating a process conducted by suspended and resumed Page Read and Page Program commands from the controller for two memory banks in the same flash memory device using the modular command structure.

FIG. 24 illustrates a flow for a suspending and resuming operations being performed in two memory banks of the same flash memory device where a Page Read operation is being performed at memory bank 0 and a Page Program operation is being performed at memory bank 1. A Burst Data Load Start is given to memory bank 1 in step 2302 along with data to the programmed into memory bank 1. Before all of the data in the Burst Data Load Start operation is loaded into memory bank 1, this operation is suspended when a Page Read command is given to memory bank 0 in step 2306. After the Page Read command has been completely received by memory bank 0, and while memory bank 0 is accessing the requested page, the operation on memory bank 1 is resumed in step 2308 using a Burst Data Load operation with the remaining data. Once the data has been provided to memory bank 1, a Page Program command is given to memory bank 1 in step 2310 to start programming of the data therein. A time $t_R$ is allowed to elapse in step 2312 after the Page Read command is given to memory bank 1 in step 2306. Once $t_R$ has elapsed, a Burst Data Read command is given to memory bank 0 in step 2314 to start the extraction of the requested data from memory bank 0. The Burst Data Read command is suspended in step 2316 when a Read Status command is given to memory bank 1 in step 2318 to monitor the status of the memory bank. The Burst Data Read command is resumed in step 2320 once the Read Status command has been received. Memory bank 1 returns a pass to the Read Status command when the Page Program operation is complete and other operations can be performed by memory bank 1.

Figure 25:
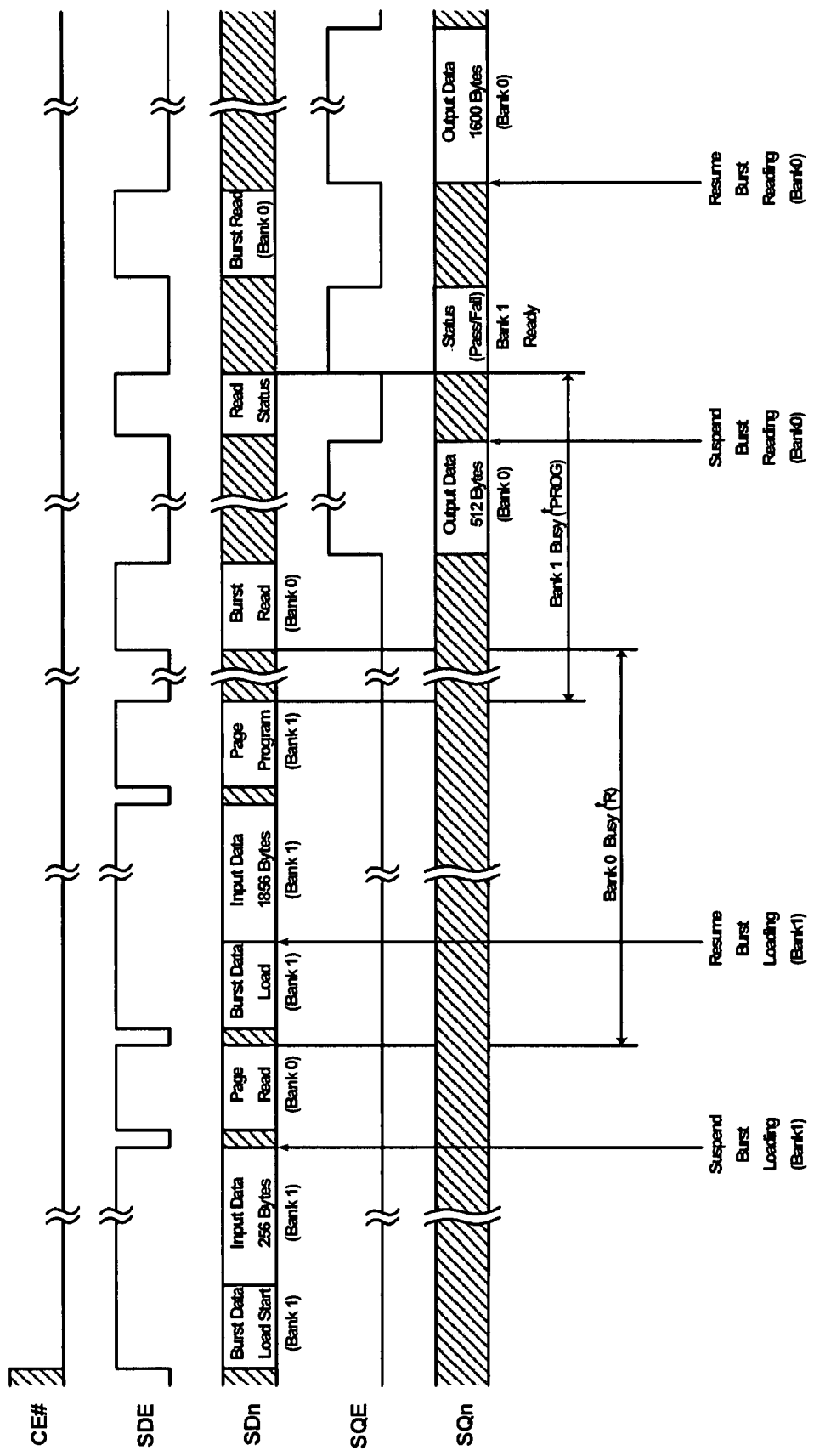
FIG. 25 illustrates a timing from the flash memory device of suspended and resumed Page Read and Page Program operations for two memory banks in the same flash memory device using the modular command structure.

FIG. 25 illustrates a timing of the suspended and resumed Page Read and Page Program operations from FIG. 24.

Figure 26:
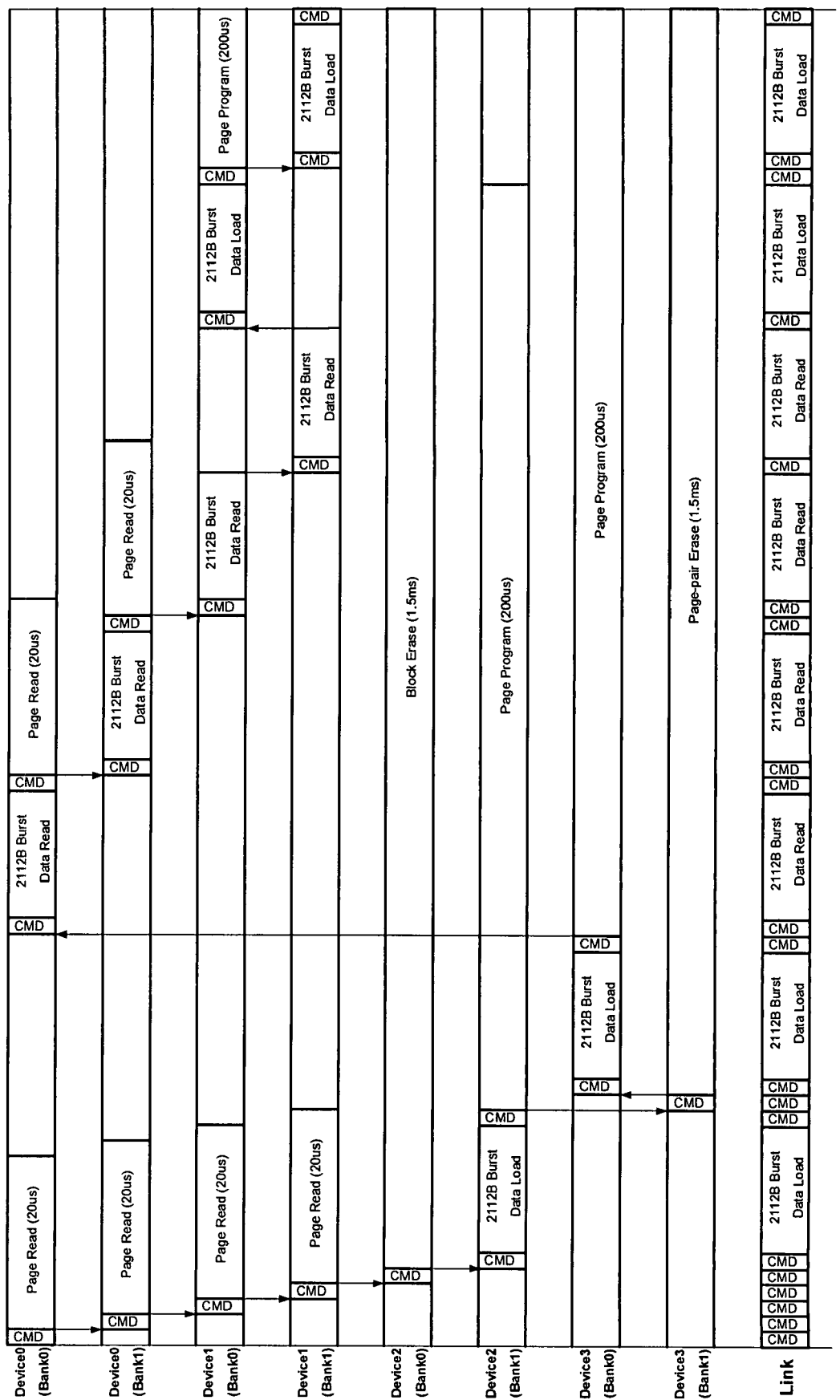
FIG. 26 illustrates an example of interleaved and concurrent Page Read, Block Erase, Page Program and Page-pair Erase commands/operations for multiple flash memory devices, each having multiple memory banks.
Figure 27:
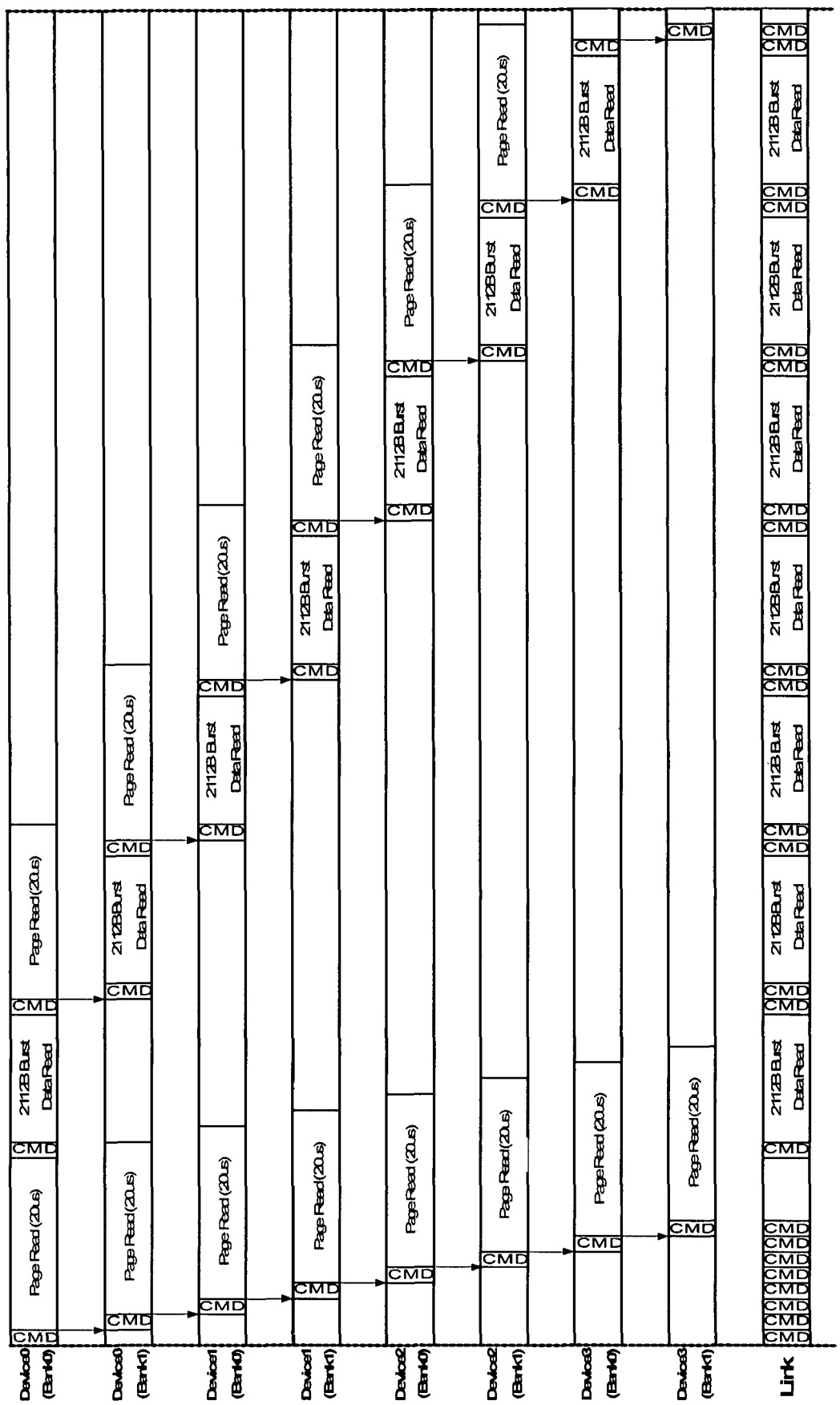
FIG. 27 illustrates an example of interleaved and concurrent Page Read commands/operations for multiple flash memory devices, each having multiple memory banks.
Figure 28:
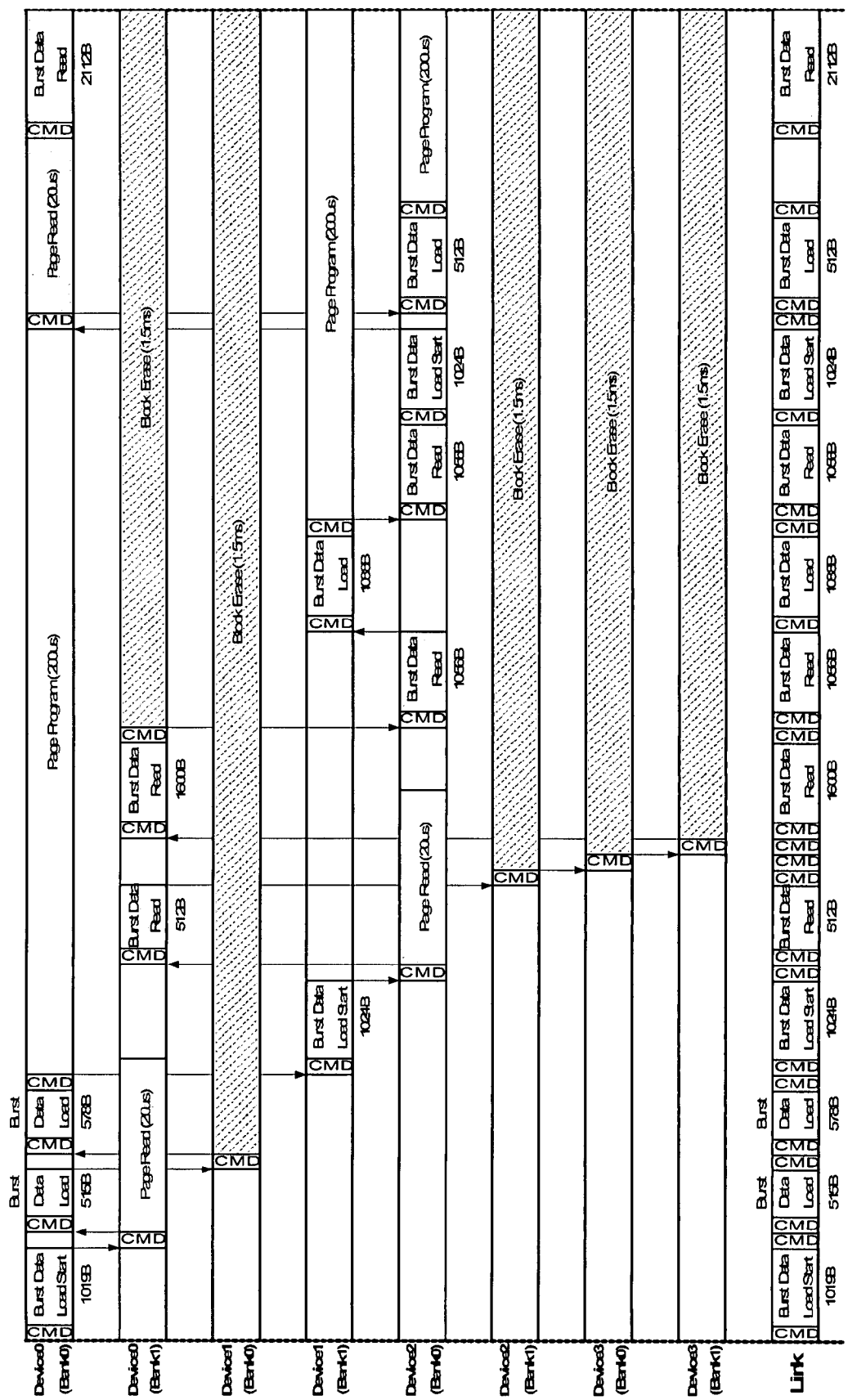
FIG. 28 illustrates an example of interleaved and concurrent suspended and resumed Page Read, Block Erase, Page Program and commands/operations for multiple flash memory devices, each having multiple memory banks.

FIGS. 26 to 28 show interleaving of operations between multiple devices. FIG. 26 shows Page Read operations at both memory bank 0 and memory bank 1 of flash device 0 and flash device 1, a Block Erase operation at memory bank 0 of flash device 2, Page Program operations at memory bank 1 of flash device 2 and at memory bank 0 of flash device 3 and a Pair-pair Erase operation at memory bank 1 of flash device 3. FIG. 27 shows Page Read operations at memory banks 0 and 1 of flash devices 0, 1, 2 and 3. FIG. 28 shows a Page Program operation at memory bank 0 of flash device 0 followed by a Page Read operation, a Page Read operation followed by a Block Erase operation at memory bank 1 of flash device 0, Block Erase operations at memory bank 0 of flash devices 1 and 3 and at memory bank 1 of flash devices 2 and 3, a Page Program operation at memory bank 1 of flash device 1, and a Page Read operation followed by a Page Program operation at memory bank 0 of flash device 2.

In the above described embodiments, the memory devices have been described as flash memory devices. It will be apparent to those of ordinary skill in the art that the memory devices can be random access memory devices: e.g., dynamic random access memories (DRAMs), static random access memories (SRAMs), magnetoresistive random access memories (MRAMs). Also, the plurality of memory devices included in a memory system can be devices having identical device type or mixed device types. A configuration of series-connected multiple devices of mixed type is disclosed in U.S. Provisional Patent Application No. 60/868,773 filed Dec. 6, 2006, the disclosure of which is incorporated herein by reference in its entirety.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration, the elements, circuits and devices are coupled either directly or indirectly with each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A system comprising:
   a memory system including a plurality of memory devices for storing data;
   a processor for managing a request for access to the memory system; and
   a controller for translating the request from the processor to a plurality of separatable commands of a modular structure interpretable by at least one of the plurality of memory devices, the plurality of separatable commands comprising an address identifier for the at least one of the plurality of memory devices and a command identifier representing an operation to be performed by the at least one of the plurality of memory devices, the plurality of memory devices and the controller being in a series-connection for communication, the at least one of the plurality of memory devices including at least two memory banks, the address identifier including a device address for the at least one of the plurality of memory devices and a bank address for at least one of the at least two memory banks, the controller being configured to produce the plurality of separatable commands for each of the at least two memory banks to interleave issuance of the plurality of separatable commands, so that the at least two memory banks are concurrently processing the issued plurality of separatable commands.

2. The system of claim 1, wherein the plurality of memory devices in the memory system are connected to a common bus.

3. The system of claim 1, wherein the plurality of memory devices in the memory system are series-interconnected.

4. The system of claim 1, wherein the at least one of the plurality of memory devices comprises a flash memory device.

5. The system of claim 4, wherein the flash memory device comprises a NAND flash memory device.

* * * * *

UNITED STATES PATENT AND TRADEMARK OFFICE
CERTIFICATE OF CORRECTION

PATENT NO. : 7,904,639 B2
APPLICATION NO. : 11/840692
DATED : March 8, 2011
INVENTOR(S) : Jin-Ki Kim, HakJune Oh and Hong Beom Pyeon Page 1 of 1

It is certified that error appears in the above-identified patent and that said Letters Patent is hereby corrected as shown below:

On the Title Page
Under the References Cited Item (56), the Other Publications Document section is missing a NPL reference, please add the following:

--SAITO, et al., "A Programmable 80ns 1Mb CMOS EPROM", IEEE ISSCC Digest of Technical Papers, 2-14-85, pp. 176-177, 340--

Signed and Sealed this
Twelfth Day of April, 2011

David J. Kappos
*Director of the United States Patent and Trademark Office*